(12) United States Patent
Yamashiro et al.

(10) Patent No.: US 11,282,948 B2
(45) Date of Patent: Mar. 22, 2022

(54) WIDE BAND GAP SEMICONDUCTOR DEVICE AND POWER CONVERSION APPARATUS

(71) Applicant: Mitsubishi Electric Corporation, Tokyo (JP)

(72) Inventors: Yusuke Yamashiro, Tokyo (JP); Kenji Hamada, Tokyo (JP); Kazuya Konishi, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/973,057

(22) PCT Filed: Aug. 2, 2018

(86) PCT No.: PCT/JP2018/028993
§ 371 (c)(1),
(2) Date: Dec. 8, 2020

(87) PCT Pub. No.: WO2020/026401
PCT Pub. Date: Feb. 6, 2020

(65) Prior Publication Data
US 2021/0273083 A1     Sep. 2, 2021

(51) Int. Cl.
*H01L 29/73* (2006.01)
*H01L 29/16* (2006.01)
(Continued)

(52) U.S. Cl.
CPC ...... *H01L 29/7397* (2013.01); *H01L 29/1608* (2013.01); *H01L 29/66333* (2013.01)

(58) Field of Classification Search
CPC .......... H01L 29/1608; H01L 29/66734; H01L 29/7813; H01L 29/4916
(Continued)

(56) References Cited

U.S. PATENT DOCUMENTS 5,742,076 A * 4/1998 Sridevan ............... H01L 21/049
                                                    257/77
6,303,410 B1 * 10/2001 Baliga ................. H01L 29/7813
                                                    438/138
(Continued)

FOREIGN PATENT DOCUMENTS

JP     61-222260 A    10/1986
JP     7-130999 A     5/1995
(Continued)

OTHER PUBLICATIONS

International Search Report and Written Opinion dated Oct. 2, 2018, received for PCT Application No. PCT/JP2018/028993, filed on Aug. 2, 2018, 6 pages including English Translation.

*Primary Examiner* — Igwe U Anya
(74) *Attorney, Agent, or Firm* — Xsensus LLP

(57) ABSTRACT

Provided is a technique capable of obtaining sufficient latch-up tolerance and enabling integration. The wide band gap semiconductor device includes: a collector region, a charge storage region having an impurity concentration higher than that of the drift region, a base region, a charge extraction region having an impurity concentration higher than that of the base region, an emitter region, a Schottky electrode, a gate insulating film, a gate electrode, an emitter electrode, and a collector electrode.

13 Claims, 16 Drawing Sheets

(51) Int. Cl.
*H01L 29/66* (2006.01)
*H01L 29/739* (2006.01)

(58) Field of Classification Search
USPC .......................................................... 257/288
See application file for complete search history.

(56) References Cited

U.S. PATENT DOCUMENTS

| | | |
|---|---|---|
| 2004/0084722 A1 | 5/2004 | Yamaguchi et al. |
| 2010/0140628 A1 | 6/2010 | Zhang |
| 2015/0179636 A1* | 6/2015 | Pfirsch .............. H01L 29/66348 257/140 |
| 2019/0165102 A1* | 5/2019 | Fujimoto .............. H01L 21/046 |

FOREIGN PATENT DOCUMENTS

| | | |
|---|---|---|
| JP | 11-345969 A | 12/1999 |
| JP | 2000-164859 A | 6/2000 |
| JP | 2001-127286 A | 5/2001 |
| JP | 2002-100774 A | 4/2002 |
| JP | 2004-153112 A | 5/2004 |
| JP | 2008-211178 A | 9/2008 |

* cited by examiner

F I G. 2
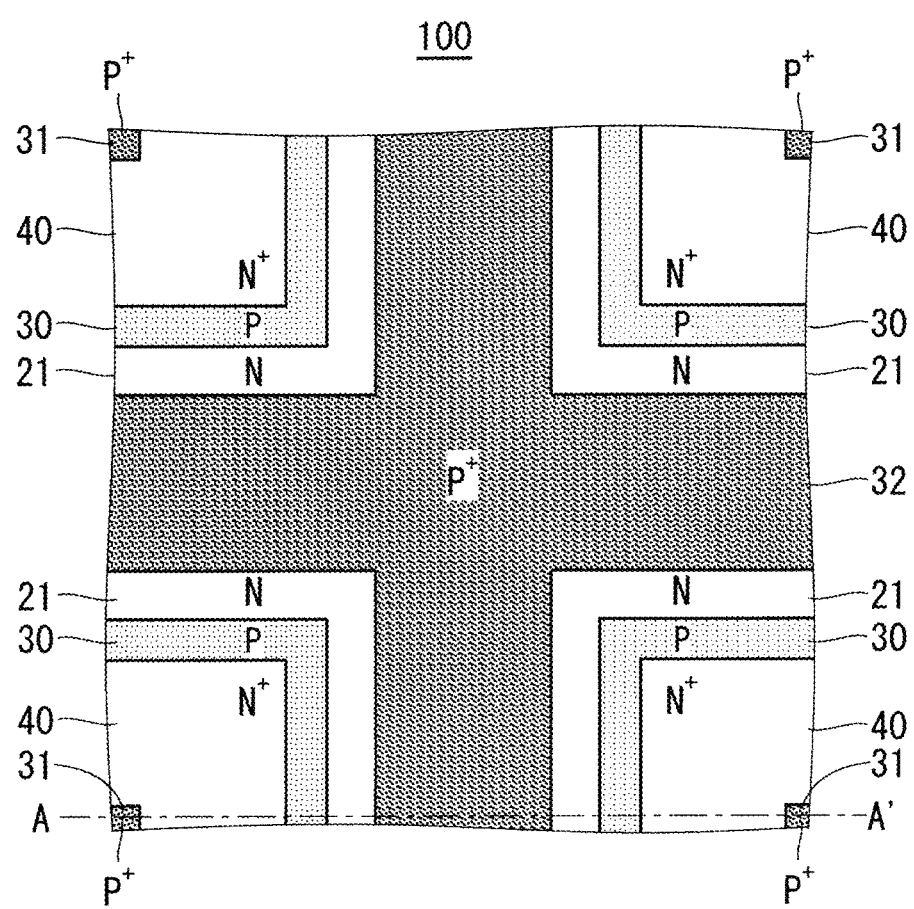

F I G. 8
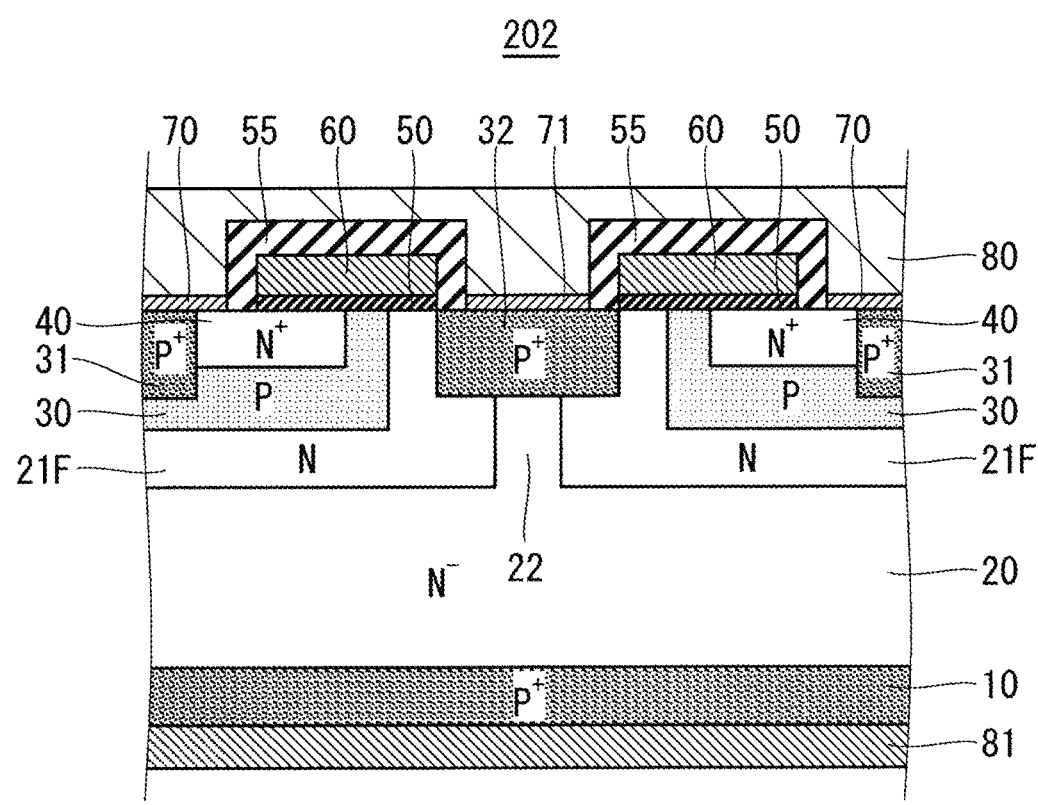

F I G. 9
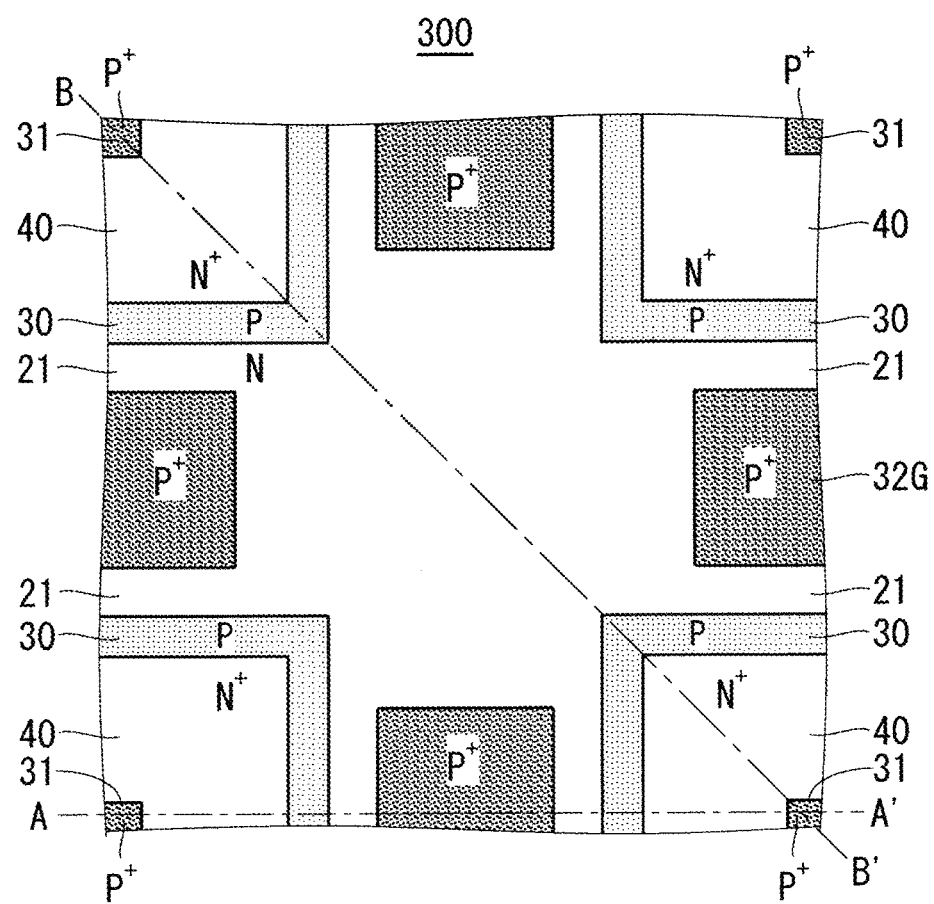

F I G. 1 1
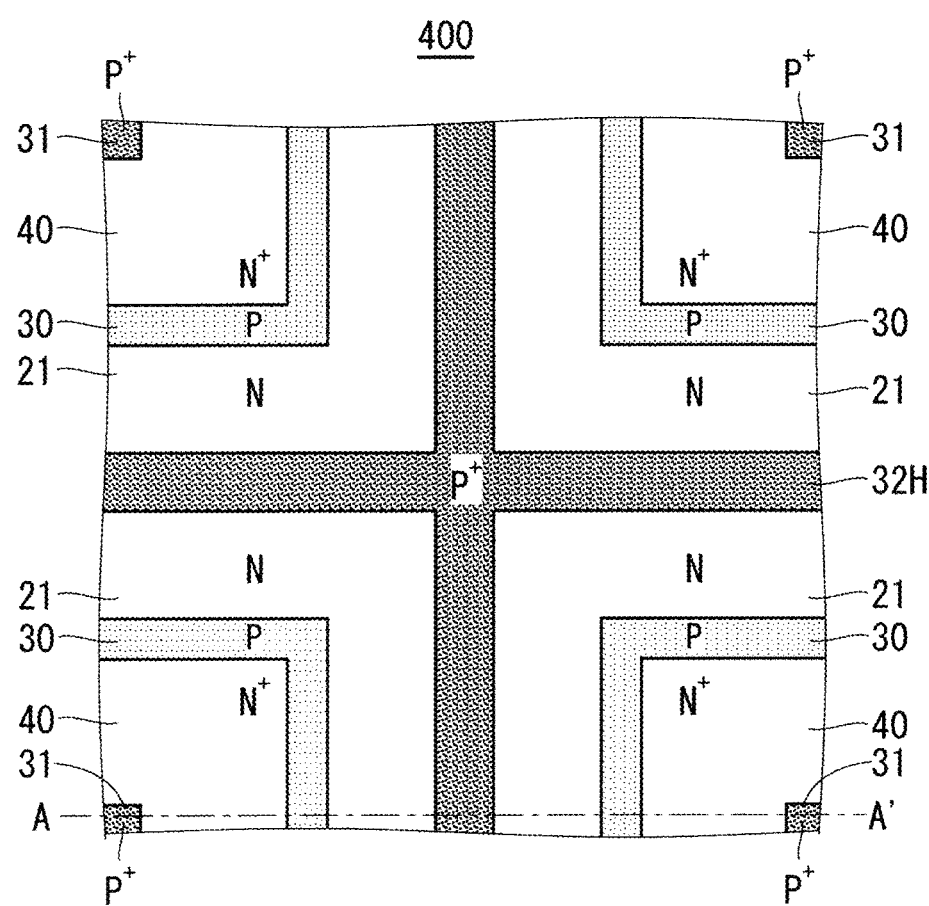

F I G. 1 5
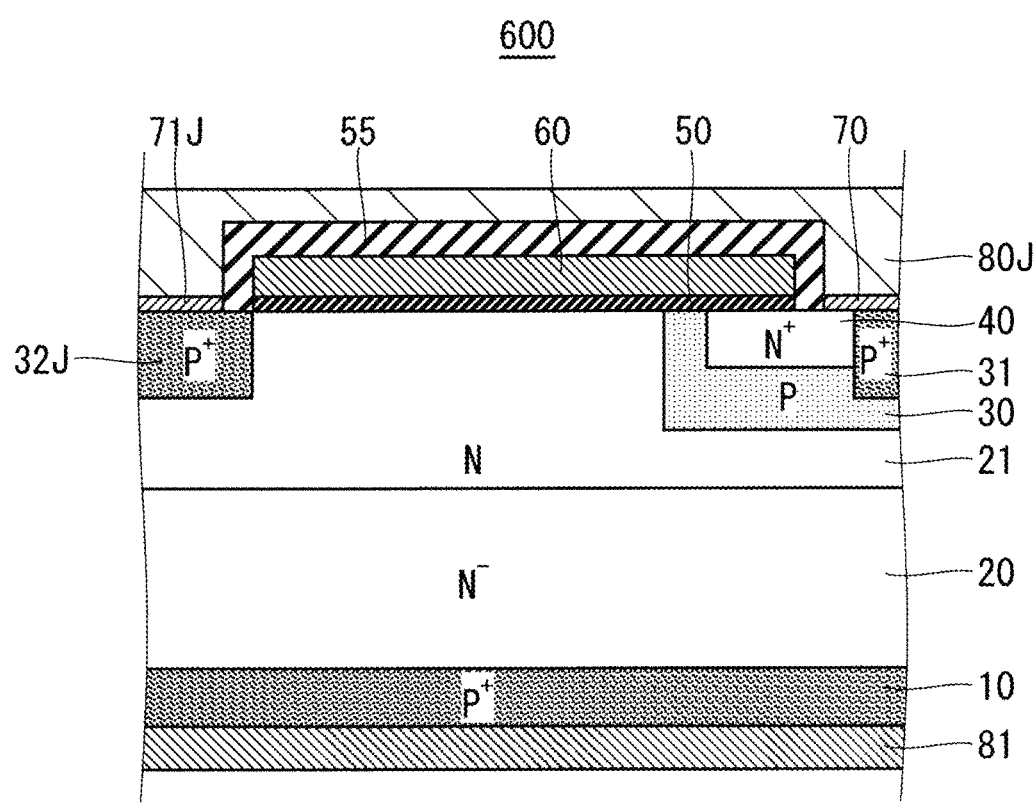

WIDE BAND GAP SEMICONDUCTOR DEVICE AND POWER CONVERSION APPARATUS

CROSS-REFERENCE TO RELATED APPLICATIONS

The present application is based on PCT filing PCT/JP2018/028993, filed Aug. 2, 2018, the entire contents of which are incorporated herein by reference.

TECHNICAL FIELD

The technique disclosed in the present specification relates to a wide band gap semiconductor device and a power conversion apparatus.

BACKGROUND ART

A wide band gap semiconductor transistor has been mainly developed of a metal-oxide-semiconductor field-effect transistor (namely, MOSFET) type. However, since it is necessary to reduce conduction loss under an ultrahigh breakdown voltage, a bipolar type transistor has drawn attention. An insulated gate bipolar transistor (that is, IGBTs) is required to have devices with low on-resistance, low switching loss, and high durability.

In the IGBT, modes in which a device failure occurs include a latch-up mode. In the latch-up mode, when transition is made from the ON state where a main current flows to the OFF state where a main current does not flow, and when a voltage drop due to the hole current flowing in the P-type base region exceeds the built-in voltage between the emitter region having a relatively high concentration (N$^+$) of N-type impurities and the P-type base region, a parasitic thyristor is turned on to further come into a latch-up state in which a current continues to flow, resulting in damage to the device.

In addition, in the ON state where the main current flows, when most of the holes implanted from the P-type collector region into the N-type drift region escape into the P-type base region, the carrier concentration in the N-type drift region is not increased, and the on-resistance cannot be lowered.

As described above, holes have to be accumulated in the N-type drift region in the ON state, and the hole current flowing to the P-type base region has to be reduced when transition is made from the ON state to the OFF state.

For such a problem, for example, in Patent Document 1, in an IGBT having a trench gate, a dummy cell capable of flowing a hole current to an emitter electrode is formed in addition to a main cell through which a main current is flown. Furthermore, in the dummy cell, a structure having rectifier elements connected in series is disclosed.

In this structure, since holes flow into the dummy cell when transition is made from the ON state to the OFF state, the hole current flowing directly below the N-type emitter region of the main cell connected in parallel with the dummy cell is reduced, and the latch-up tolerance is increased.

Furthermore, in the ON state, only the voltage not higher than the built-in voltage (about 0.7 V) is applied to the rectifier element, so that the holes are not discharged. Therefore, it is possible to secure high latch-up tolerance and low on-resistance.

PRIOR ART DOCUMENT

Patent Document

Patent Document 1: Japanese Patent Application Laid-Open No. 2004-153112

SUMMARY

Problem to be Solved by the Invention

In the configuration disclosed in Patent Document 1, the built-in voltage of the rectifier element is about 0.7 V, which corresponds to the built-in potential of the Si PN junction. When the PN junction between the emitter region and the base region is formed of Si, this PN junction has a built-in voltage of about 0.7 V as with the rectifier element described above. When the rectifier element is applied with a voltage of 0.7 V to be made conductive, the PN junction between the emitter region and the base region may also be applied with a voltage of about 0.7 V to be made conductive.

The same is true when the IGBT and the rectifier element are made of SiC PN junctions, so that any of the built-in voltages are about 2.5 V, and sufficient latch-up tolerance cannot be obtained.

Although manufacturing the IGBT with SiC and manufacturing the rectifier element with Si allow the built-in voltages to be made different, since the IGBT and the rectifier element cannot be densely formed, the resistance value per unit area cannot be reduced.

In addition, in the configuration disclosed in Patent Document 1, the rectifier element is provided outside the device. Therefore, in order to connect the P-type region in the dummy cell with the rectifier element, an electrode different from the gate electrode or the emitter electrode (specifically, a diverter electrode) is required.

The diverter electrode and the rectifier element are connected by a method such as wire bonding. Therefore, an electrode pad being large to some extent in area (specifically, a diverter electrode pad) is needed to be formed on the device, which makes integration difficult.

The technique disclosed in the specification of the present application has been made in order to solve the problems described above, and the present invention has an object to provide a technique that can obtain a sufficient latch-up tolerance and enables integration.

Means to Solve the Problem

A first aspect of the technology disclosed in the specification of the present application includes: a drift region made of a first conductivity type wide band gap semiconductor; a collector region made of a second conductivity type wide band gap semiconductor, the collector region formed on a lower surface of the drift region; a charge storage region made of a first conductivity type wide band gap semiconductor, the charge storage region formed on an upper surface of the drift region and having an impurity concentration higher than that of the drift region; a base region of a second conductivity type, the base region partially formed in a surface layer of the charge storage region; a charge extraction region of a second conductivity type, the charge extraction region formed to be separated from the base region in a surface layer of the charge storage region and having an impurity concentration higher than that of the base region; an emitter region of a first conductivity type, the emitter region partially formed in a surface layer of the base region and having an impurity concentration higher than that of the charge storage region; a Schottky electrode formed in contact with the charge extraction region and Schottky-connected to the charge extraction region; a gate insulating film formed in contact with the base region at a position sandwiched between the charge storage region and the emitter region; a gate electrode formed in contact with the gate insulating film; an emitter electrode formed to cover the Schottky electrode and the emitter region; and a collector electrode formed on a lower surface of the collector region.

In addition, a second aspect of the technology disclosed in the specification of the present application includes: a conversion circuit including a wide band gap semiconductor device described above, the conversion circuit configured to convert and output power to be input; a drive circuit configured to output a drive signal for driving the wide band gap semiconductor device to the wide band gap semiconductor device; and a control circuit configured to output a control signal for controlling the drive circuit to the drive circuit.

Effects of the Invention

A first aspect of the technology disclosed in the specification of the present application includes: a drift region made of a first conductivity type wide band gap semiconductor; a collector region made of a second conductivity type wide band gap semiconductor, the collector region formed on a lower surface of the drift region; a charge storage region made of a first conductivity type wide band gap semiconductor, the charge storage region formed on an upper surface of the drift region and having an impurity concentration higher than that of the drift region; a base region of a second conductivity type, the base region partially formed in a surface layer of the charge storage region; a charge extraction region of a second conductivity type, the charge extraction region formed to be separated from the base region in a surface layer of the charge storage region and having an impurity concentration higher than that of the base region; an emitter region of a first conductivity type, the emitter region partially formed in a surface layer of the base region and having an impurity concentration higher than that of the charge storage region; a Schottky electrode formed in contact with the charge extraction region and Schottky-connected to the charge extraction region; a gate insulating film formed in contact with the base region at a position sandwiched between the charge storage region and the emitter region; a gate electrode formed in contact with the gate insulating film; an emitter electrode formed to cover the Schottky electrode and the emitter region; and a collector electrode formed on a lower surface of the collector region. According to this configuration, since the Schottky connection conducts at a voltage lower than that of the PN connection at the interface between the base region and the emitter region, a voltage not less than the built-in voltage is not applied to the PN junction. As a result, the latch-up tolerance is increased, and the reliability of the wide band gap semiconductor device is improved. In addition, since the structure having the Schottky connection is formed in the same cell as the base region, the elements can be integrated. Therefore, the resistance per unit area can be reduced.

In addition, a second aspect of the technology disclosed in the specification of the present application includes: a conversion circuit including a wide band gap semiconductor device described above, the conversion circuit configured to convert and output power to be input; a drive circuit configured to output a drive signal for driving the wide band gap semiconductor device to the wide band gap semiconductor device; and a control circuit configured to output a control signal for controlling the drive circuit to the drive circuit. According to this configuration, since the Schottky connection conducts at a voltage lower than that of the PN connection at the interface between the base region and the emitter region, a voltage not less than the built-in voltage is not applied to the PN junction. As a result, the latch-up tolerance increases, and the reliability of the power conversion apparatus improves. In addition, since the structure having the Schottky connection is formed in the same cell as the base region, the elements can be integrated. Therefore, the resistance per unit area can be reduced.

In addition, the objects, features, aspects, and advantages regarding the technology disclosed in the specification of the present application will become further apparent from the detailed description and the accompanying drawings shown hereinafter.

BRIEF DESCRIPTION OF DRAWINGS

FIG. 2 is a plan view schematically showing an example of the configuration of the semiconductor device according to the embodiment when the upper electrode and the dielectric film to be formed after the semiconductor element is formed are omitted.

FIG. 8 is a cross-sectional view schematically showing an example of the configuration of the IGBT according to the embodiment.

FIG. 9 is a plan view schematically showing an example of the configuration of the semiconductor device according to the embodiment when the upper electrode and the dielectric film to be formed after the semiconductor element is formed are omitted.

FIG. 11 is a plan view schematically showing an example of the configuration of the semiconductor device according to the embodiment when the upper electrode and the dielectric film to be formed after the semiconductor element is formed are omitted.

FIG. 15 is a cross-sectional view schematically showing an example of the configuration of the IGBT according to the embodiment.

DESCRIPTION OF EMBODIMENTS

Figure 1:
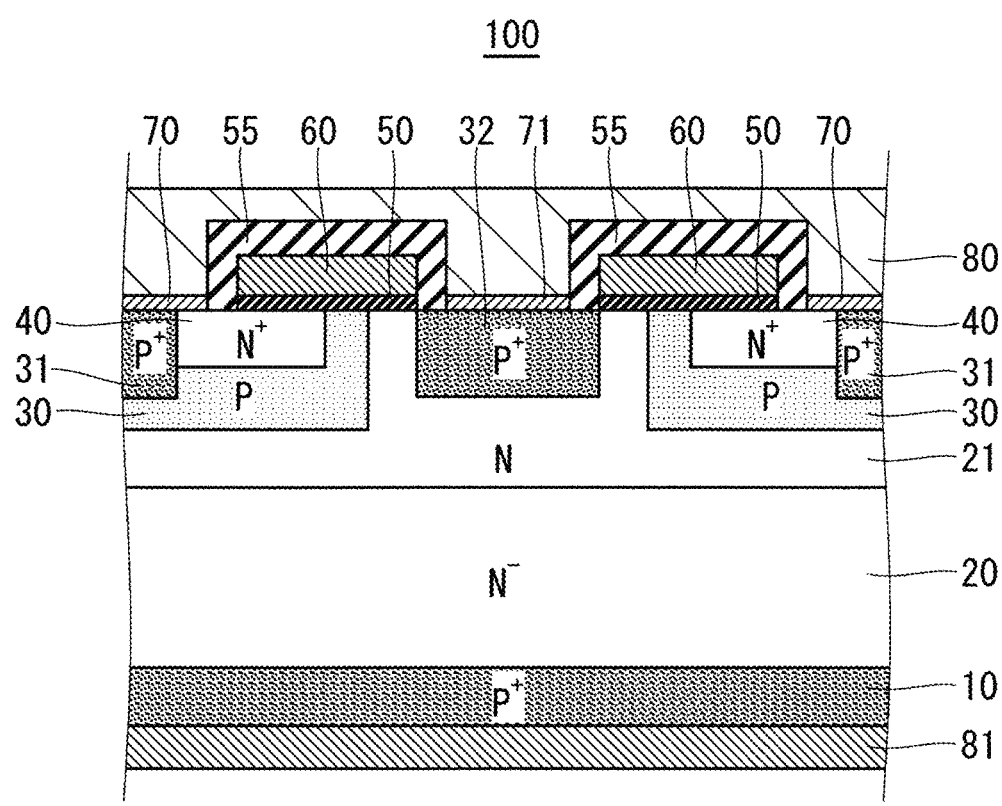
FIG. 1 is a cross-sectional view schematically showing an example of the configuration of an IGBT as a semiconductor device according to the embodiment.

Hereinafter, embodiments will be described with reference to the accompanying drawings.

It should be noted that the drawings are schematically illustrated, and for convenience of description, the configuration may be omitted or the configuration may be simplified as appropriate. In addition, the mutual relationship between the sizes and positions of the respective configurations shown in the different drawings is not necessarily described accurately and can be appropriately changed. In addition, in drawings such as plan views other than cross-sectional views, hatching may be added in order to facilitate understanding of the contents of the embodiments.

In addition, in the following description, the same components are denoted by the same reference numerals to be illustrated, and their names and functions are also the same. Therefore, detailed descriptions thereof may be omitted to avoid overlapping.

In addition, in the following description, terms that mean a specific position and direction such as "upper", "lower", "left", "right", "side", "bottom", "front", or "back" may be used, but these terms are used to facilitate understanding of the contents of the embodiments for convenience and are not related to the direction at the time of actual implementation.

In addition, in the following description, an ordinal number such as "first" or "second" may be used, but these terms are used to facilitate understanding of the contents of the embodiments for convenience, and are not limited to the order or the like that can be generated by these ordinal numbers.

First Embodiment

In the following, a wide band gap semiconductor device and a method for manufacturing the wide band gap semiconductor device according to the present embodiment will be described.

<IGBT Configuration>

FIG. 1 is a cross-sectional view schematically showing an example of the configuration of an IGBT 100 as a semiconductor device according to the present embodiment. FIG. 2 is a plan view schematically showing an example of the configuration of the semiconductor device according to the present embodiment when the upper electrode and the dielectric film to be formed after the semiconductor element is formed are omitted. FIG. 1 corresponds to the A-A' cross section in FIG. 2.

It should be noted that FIG. 2 shows an example in which the unit cells are arranged in a grid pattern. However, in addition to that, the unit cells may be also assumed to be arranged in a comb shape, a ladder shape, or a stripe shape.

Figure 3:
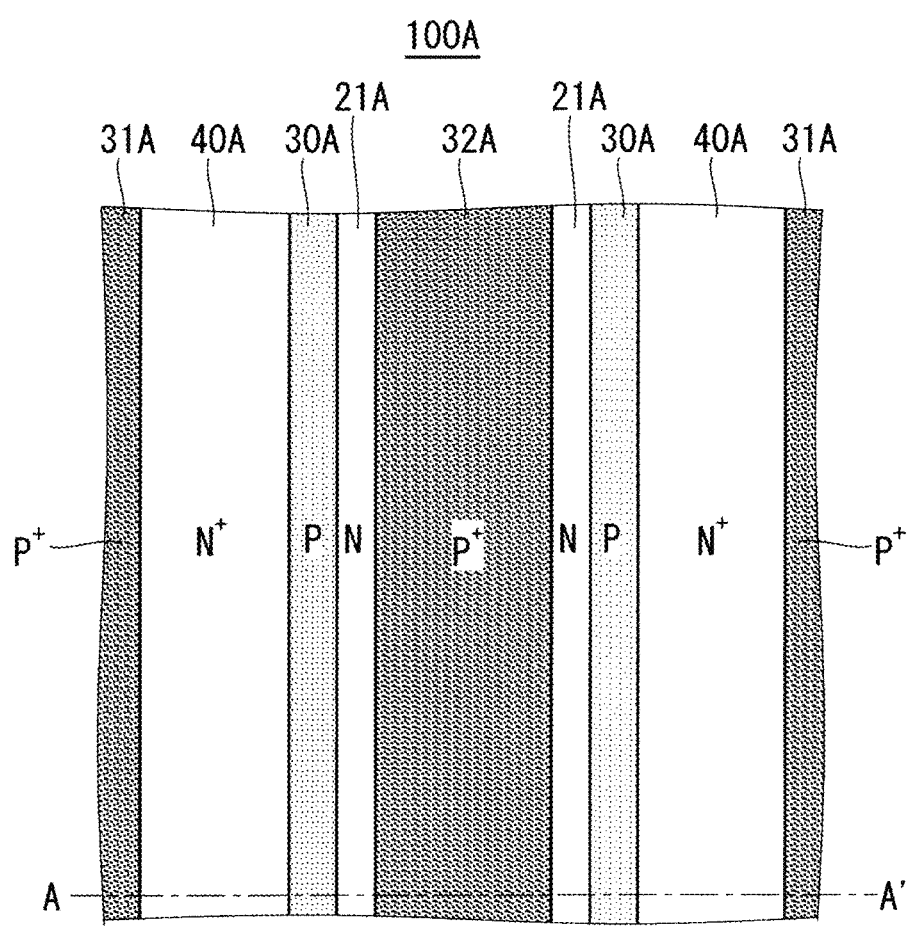
FIG. 3 is a plan view schematically showing an example of the configuration of the semiconductor device according to the embodiment when the unit cells are arranged in a comb shape.
Figure 4:
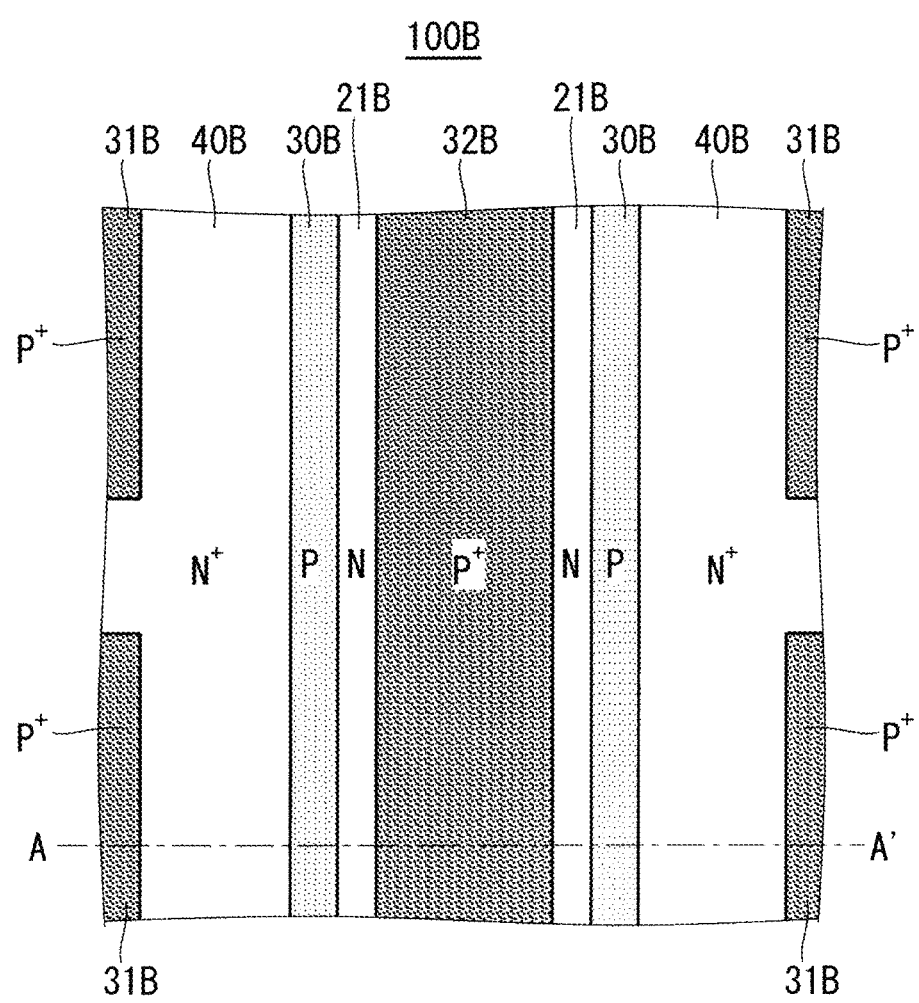
FIG. 4 is a plan view schematically showing an example of the configuration of the semiconductor device according to the embodiment when the unit cells are arranged in a ladder shape.
Figure 5:
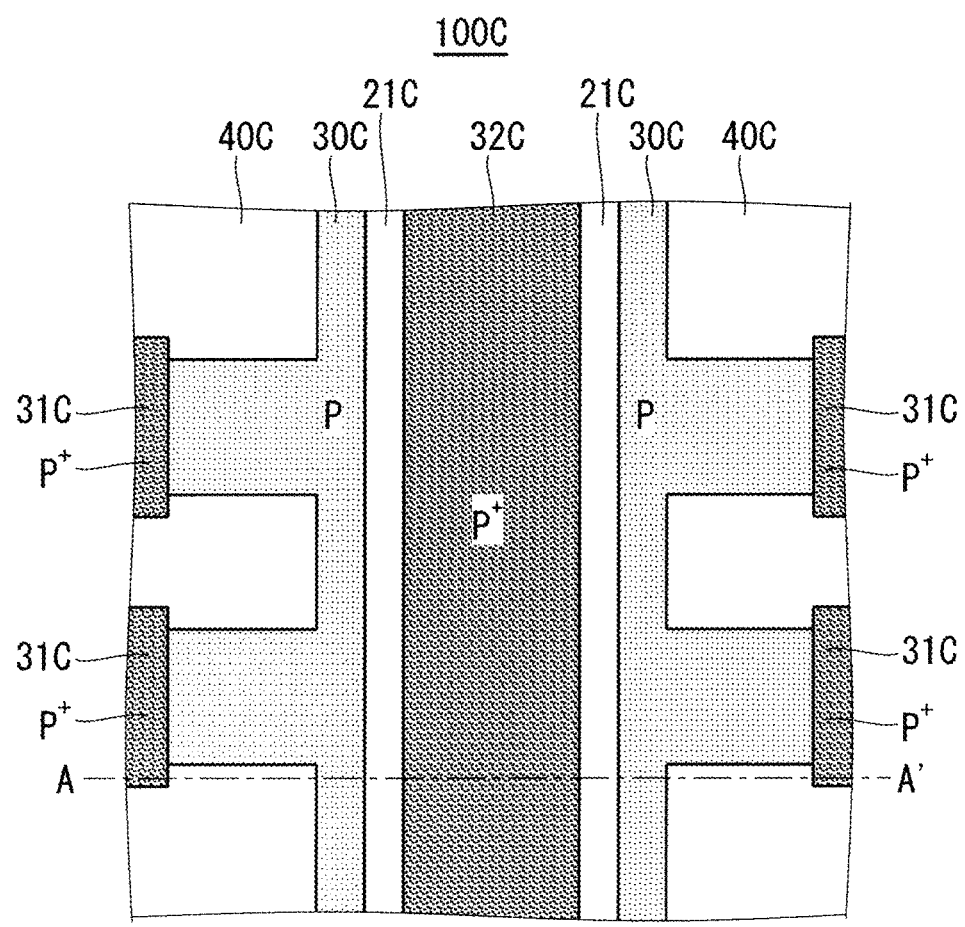
FIG. 5 is a plan view schematically showing an example of the configuration of the semiconductor device according to the embodiment when the unit cells are arranged in a stripe shape.

FIG. 3 is a plan view schematically showing an example of the configuration of the semiconductor device according to the present embodiment when the unit cells are arranged in a comb shape. In addition, FIG. 4 is a plan view schematically showing an example of the configuration of the semiconductor device according to the present embodiment when the unit cells are arranged in a ladder shape. In addition, FIG. 5 is a plan view schematically showing an example of the configuration of the semiconductor device according to the present embodiment when the unit cells are arranged in a stripe shape. FIG. 1 corresponds to the A-A' cross section in each of FIGS. 3, 4, and 5.

As illustrated in FIG. 1, the IGBT 100 includes a P-type collector region 10 having P-type impurities at a relatively high concentration (Pt), an N-type drift region 20 stacked on one main surface of the collector region 10 (that is, the upper surface), and an N-type charge storage region 21 stacked on the upper surface of the drift region 20. Here, the charge storage region 21 has a higher impurity concentration than the drift region 20.

It should be noted that the semiconductor material used for the IGBT 100 is a wide band gap semiconductor having a band gap larger than that of a silicon semiconductor, and may be silicon carbide, for example.

Here, the wide band gap semiconductor generally refers to a semiconductor having a forbidden band width of about 2 eV or more, and known are Group 3 nitrides such as gallium nitride (GaN), Group 2 oxides such as zinc oxide (ZnO), Group 2 chalcogenides such as zinc selenide (ZnSe), diamond, and silicon carbide (SiC).

Although the case where silicon carbide (SiC) is used is described in the present embodiment, the same applies to other semiconductors and wide band gap semiconductors.

In addition, in the present embodiment, a planar gate type SiC-IGBT in which the channel region is formed perpendicularly to the thickness direction of the IGBT 100 (that is, the vertical direction in FIG. 1) will be described as an example.

In the surface layer of the charge storage region 21, a plurality of base regions 30 made of P-type wide band gap semiconductors are selectively provided. In addition, in the surface layer of each of the base regions 30, an emitter region 40 made of an N-type wide band gap semiconductor is formed at a position inside the outer periphery of the base region 30 by a predetermined distance. In addition, the emitter region 40 has a higher impurity concentration than the charge storage region 21.

A well contact region 31 made of a low-resistance P-type wide band gap semiconductor is formed inside each emitter region 40. The well contact region 31 is formed to reach the base region 30 from the upper surface of the emitter region 40.

In addition, in the surface layer of the charge storage region 21, a charge extraction region 32 made of a P-type wide band gap semiconductor is formed to be separated from the base region 30. In addition, the charge extraction region 32 has a higher impurity concentration than the base region 30.

An ohmic electrode 70 is formed across part of the upper surface of the emitter region 40 and part of the upper surface of the well contact region 31. The ohmic electrode 70 is ohmic-connected with the wide band gap semiconductor.

A Schottky electrode 71 is formed on the upper surface of the charge extraction region 32. The Schottky electrode 71 is Schottky-connected to the P-type silicon carbide semiconductor layer (charge extraction region 32).

The rising voltage when a forward voltage is applied to the Schottky connection is set to, for example, 0.2 V or more and 2.0 V or less. The rising voltage may be 1.0 V, for example.

In addition, a gate insulating film 50 is formed across the upper surface of the base region 30 and the upper surface of the charge extraction region 32. The gate insulating film 50 is formed in contact with the base region 30 at a position sandwiched between the charge storage region 21 and the emitter region 40. In addition, a gate electrode 60 is formed at a position where the gate insulating film 50 overlaps the base region 30 in a plan view with the gate insulating film 50 interposed therebetween. In addition, an interlayer insulating film 55 is formed to cover the gate electrode 60.

In addition, an emitter electrode 80 is formed to cover the upper surface of the opened ohmic electrode 70, the upper surface of the opened Schottky electrode 71, and the upper surface of the interlayer insulating film 55.

The emitter electrode 80 is electrically connected to the ohmic electrode 70 and the Schottky electrode 71. The interlayer insulating film 55 is formed between the emitter electrode 80 and the gate electrode 60. In addition, a collector electrode 81 is formed on the lower surface of the collector region 10.

FIG. 2 is a plan view schematically showing an example of the configuration of the semiconductor device according to the present embodiment. As illustrated in FIG. 2, in the IGBT 100, the emitter region 40 is formed to surround the well contact region 31. In addition, the base region 30 is formed to surround the emitter region 40. In addition, the charge storage region 21 is formed to surround the base region 30.

The respective cell regions thus formed are formed to be separated from each other. Then, the respective cell regions are two-dimensionally arranged in the left-right direction and the up-down direction in FIG. 2.

In FIG. 2, the charge extraction region 32 is formed in a region where the cell region is not formed. The charge extraction region 32 is formed in each of the laterally extending region in which the cell region is not formed and the vertically extending region in which the cell region is not formed.

FIG. 3 is a plan view schematically showing an example of the configuration of the semiconductor device according to the present embodiment when the unit cells are arranged in a comb shape. As illustrated in FIG. 3, in an IGBT 100A, emitter regions 40A are formed to sandwich a well contact region 31A. In addition, base regions 30A are formed to sandwich an emitter region 40A. In addition, charge storage regions 21A are formed to sandwich the base region 30A. The comb-shaped cell regions thus formed are formed to be separated from each other, and a charge extraction region 32A is formed in the region between the cell regions.

FIG. 4 is a plan view schematically showing an example of the configuration of the semiconductor device according to the present embodiment when the unit cells are arranged in a ladder shape. As illustrated in FIG. 4, in an IGBT 100B, emitter regions 40B are formed to sandwich a well contact region 31B intermittently formed in the longitudinal direction. In addition, base regions 30B are formed to sandwich the emitter region 40B. In addition, charge storage regions 21B are formed to sandwich the base region 30B. The ladder-shaped cell regions thus formed are formed to be separated from each other, and a charge extraction region 32B is formed in the region between the cell regions.

FIG. 5 is a plan view schematically showing an example of the configuration of the semiconductor device according to the present embodiment when the unit cells are arranged in a stripe shape. As illustrated in FIG. 5, in an IGBT 100C, emitter regions 40C are formed to sandwich a well contact region 31C intermittently formed in the longitudinal direction. In addition, base regions 30C are formed partially in contact with the well contact region 31C while sandwiching the emitter region 40C. In addition, charge storage regions 21C are formed to sandwich the base region 30C. The stripe-shaped cell regions thus formed are formed to be separated from each other, and a charge extraction region 32C is formed in the region between the cell regions.

<IGBT Manufacturing Method>

Next, a method for manufacturing the IGBT 100 as the semiconductor device according to the present embodiment will be described below. In the following, SiC is used as the semiconductor material, for example.

First, on the upper surface of the collector region 10, the drift region 20 made of N-type silicon carbide is epitaxially grown by chemical vapor deposition (that is, CVD) method, the N-type silicon carbide having an impurity concentration of, for example, $5 \times 10^{13}$ cm$^{-3}$ or more and $1 \times 10^{15}$ cm$^{-3}$ or less, and a film thickness of, for example, 50 μm or more and 200 μm or less.

Here, the collector region 10 is assumed to be made of P-type and low-resistance silicon carbide having the plane orientation of the first main surface being a (0001) plane having an off angle, and a polytype of 4H.

Furthermore, the charge storage region 21 is epitaxially grown on the upper surface of the drift region 20, the charge storage region 21 having an impurity concentration of, for example, $1 \times 10^{15}$ cm$^{-3}$ or more and $1 \times 10^{17}$ cm$^{-3}$ or less, and a film thickness of, for example, 1 μm or more and 10 μm or less.

Subsequently, an implantation mask is formed on a predetermined region of the upper surface of the charge storage region 21 with a photoresist or the like. Then, aluminum (Al) having P-type impurities is ion-implanted.

At this time, the depth of Al ion implantation is assumed to be, for example, 0.5 μm or more and 3 μm or less. In addition, the impurity concentration of the ion-implanted Al is in the range of, for example, $1 \times 10^{17}$ cm$^{-3}$ or more and $1 \times 10^{19}$ cm$^{-3}$ or less, and is assumed to be an impurity concentration (second impurity concentration) higher than the impurity concentration of the charge storage region 21 (first impurity concentration).

Then, the implantation mask is removed. Then, by the present step, the region into which Al is ion-implanted becomes the base region 30.

Subsequently, similarly, an implantation mask is formed on the upper surface of the charge storage region 21 with a photoresist or the like. Then, Al having P-type impurities is ion-implanted.

At this time, the depth of Al ion implantation is assumed to be, for example, 0.5 μm or more and 3 μm or less. In addition, the impurity concentration of the ion-implanted Al is in the range of, for example, $1 \times 10^{17}$ cm$^{-3}$ or more and $1 \times 10^{19}$ cm$^{-3}$ or less, and is assumed to be higher than the impurity concentration of the charge storage region 21 (first impurity concentration) and higher than the impurity concentration of the base region 30 (second impurity concentration).

Then, the implantation mask is removed. Then, by the present step, the region into which Al is ion-implanted becomes the well contact region 31 and the charge extraction region 32.

Here, the width of the charge extraction region 32 when viewed in the A-A' cross section in FIG. 2 is assumed to be, for example, 0.3 times or more and 0.5 times or less the width of the base region 30.

Subsequently, an implantation mask is formed with a photoresist or the like so that a predetermined portion inside the base region 30 on the upper surface of the charge storage region 21 is opened. Then, nitrogen (N) having N-type impurities is ion-implanted.

At this time, the N ion implantation depth is assumed to be smaller than the thickness of the base region 30. In addition, the impurity concentration of the ion-implanted N is in the range of, for example, $1 \times 10^{18}$ cm$^{-3}$ or more and $1 \times 10^{21}$ cm$^{-3}$ or less, and is assumed to exceed the P-type impurity concentration of the base region 30 (second impurity concentration).

By the present step, the N-type region in the region into which N is implanted becomes the emitter region 40.

Next, with a heat treatment apparatus, in an inert gas atmosphere such as argon (Ar) gas, the annealing treatment of, for example, 30 seconds or more and 1 hour or less is performed in the temperature range of, for example, 1300° C. or more and 1900° C. or less. By the annealing treatment, the ion-implanted Al and N are electrically activated.

Subsequently, using a chemical vapor deposition (that is, CVD) method, photolithography technology, or the like, a field insulating film made of silicon dioxide having a film thickness of, for example, 0.5 μm or more and 2 μm or less is formed on the upper surface of the silicon carbide semiconductor layer in a region other than the active region.

In order to achieve the above, for example, after the field insulating film on the entire upper surface of the silicon carbide semiconductor layer is formed, the field insulating film at a position substantially corresponding to the active region has only to be removed by photolithography technology, etching, or the like.

Next, thermally oxidizing the surface of the silicon carbide semiconductor layer not covered with the field insulating film forms a silicon oxide film being a gate insulating film 50 having a desired thickness.

Subsequently, a conductive polycrystalline silicon film is formed on the upper surface of the gate insulating film 50 and the upper surface of the field insulating film using a low pressure CVD method. Then, patterning the formed polycrystalline silicon film forms the gate electrode 60. Next, the interlayer insulating film 55 made of silicon oxide is formed using the low pressure CVD method.

Subsequently, a contact hole penetrating the interlayer insulating film 55 and the gate insulating film 50 and reaching the emitter region 40 in the active region is formed.

A sputtering method or the like forms a metal film containing Ni as a main component in the contact hole. Then, thereafter, performing heat treatment at a temperature of, for example, 600° C. or higher and 1100° C. or lower and reacting the metal film containing Ni as a main component with the silicon carbide semiconductor layer in the contact hole forms silicide between the silicon carbide semiconductor layer and the metal film.

Subsequently, the remaining metal film other than the silicide formed by the above heat treatment is removed by wet etching. The silicide thus formed forms the ohmic electrode 70.

Subsequently, a metal film containing Al and Ti as main components is formed on the lower surface of the collector region 10, and heat treatment is further performed. Doing so forms a back surface ohmic electrode (not shown here) on the back surface of the collector region 10.

Next, the interlayer insulating film 55 and the gate insulating film 50 on the upper surface of the charge extraction region 32 are removed using patterning with a photoresist or the like.

The above removal method is assumed as a method of not damaging the surface of the silicon carbide semiconductor layer to serve as the Schottky interface, for example, wet etching.

Then, depositing a metal film to serve as the Schottky electrode 71 by a sputtering method or the like and further using patterning with a photoresist or the like forms the Schottky electrode 71 on the upper surface of the charge extraction region 32 in the contact hole.

The metal film to serve as the Schottky electrode 71 may be formed of a single-layer film containing Al, Mo, Au, Ti, Ni, V, or the like, and further may be formed of a multi-layer film in which these are combined.

Next, a wiring metal such as Al is formed on the surface of the thus processed element by a sputtering method, a vapor deposition method, or the like. Then, processing the wiring metal into a predetermined shape by photolithography technology forms an emitter electrode 80 in contact with the ohmic electrode 70 and the Schottky electrode 71 on the emitter side, and forms a gate pad and a gate wiring line in contact with the gate electrode 60.

Furthermore, forming the collector electrode 81 being a metal film on the lower surface of the back surface ohmic electrode formed on the back side of the collector region 10 allows the IGBT 100 illustrated in FIG. 1 to be obtained.

<IGBT Operation>

Next, the operation of the SiC-IGBT (IGBT 100) as the semiconductor device according to the present embodiment will be described to be divided into three states.

The first state is a state in which a positive voltage is applied to the collector electrode 81 with respect to the emitter electrode 80 and a positive voltage not less than a threshold value is applied to the gate electrode 60, and is hereinafter referred to as "ON state".

In the ON state, an inversion channel is formed in the channel region, and a path through which holes and electrons being carriers flow is formed between the N-type emitter region 40 and the N-type charge storage region 21.

On the other hand, a Schottky barrier diode (that is, SBD) formed between the charge extraction region 32 and the Schottky electrode 71 is applied with a forward voltage, but the forward voltage does not reach a threshold voltage (for example, 1.0 V). Therefore, a current does not flow in the portion.

According to the electric field formed by the positive voltage applied to the collector electrode 81, the electrons flowing from the emitter electrode 80 to the collector electrode 81 reach from the emitter electrode 80 to the collector electrode 81 via the ohmic electrode 70, the emitter region 40, the base region 30, the charge storage region 21, the drift region 20, and further the collector region 10.

According to the electric field formed by the positive voltage applied to the collector electrode 81, the holes flowing from the collector electrode 81 to the emitter electrode 80 reach from the collector electrode 81 to the emitter electrode 80 via the collector region 10, the drift region 20, the charge storage region 21, the base region 30, the emitter region 40, and further the ohmic electrode 70.

In this case, some of the holes that travel from the drift region 20 to the charge storage region 21 are blocked by the potential of the interface between the drift region 20 and the charge storage region 21 and remain in the drift region 20. As a result, the carrier density of the drift region 20 increases.

Due to this effect, the structure according to the present embodiment can reduce the on-resistance as compared with the case where the charge storage region 21 is not formed.

Based on the above operation, applying a positive voltage to the gate electrode 60 causes an on-state current to flow from the collector electrode 81 to the emitter electrode 80.

In this case, the voltage applied between the emitter electrode 80 and the collector electrode 81 is referred to as on-state voltage, and the value obtained by dividing the on-state voltage by the density of the on-state current is referred to as on-resistance. The on-resistance is equal to the sum of the resistances of the paths in which the electrons and holes flow.

The product of the square of the on-state current and the on-resistance is equal to the conduction loss consumed by the IGBT during conduction. Therefore, the on-resistance is preferably low. It should be noted that the on-state current flows only in the active region where the channel region exists, and does not flow in the termination region or invalid region other than the active region.

The second state is a case where a high voltage is applied to the collector electrode 81 with respect to the emitter electrode 80 and a voltage not more than the threshold value is applied to the gate electrode 60, and is hereinafter referred to as "OFF state".

In the OFF state, no inversion channel is formed in the channel region. Therefore, an on-state current does not flow. Then, a high voltage is applied between the emitter electrode 80 and the collector electrode 81 of the IGBT.

On this occasion, since the voltage of the gate electrode 60 is approximately equal to the voltage of the emitter electrode 80, a high voltage is also applied between the gate electrode 60 and the collector electrode 81.

In the case of the OFF state, in the active region, reverse bias is applied to the PN junction formed between the base region 30 and the charge storage region 21, and a thick depletion layer spreads toward the charge storage region 21 and the drift region 20 having a relatively low concentration. This suppresses application of high voltage to the gate insulating film 50.

Reverse bias is also applied to the PN junction formed between the charge extraction region 32 and the charge storage region 21, and the depletion layer spreads. Therefore, no large voltage is applied to the Schottky junction of the Schottky electrode 71.

The third state is when transition is made from the ON state to the OFF state, and is hereinafter referred to as "turn-off transition period". In the case of the turn-off transition period, a mode in which a device failure occurs in the IGBT (for example, latch-up mode) may occur.

When transition is made from the ON state where a main current flows to the OFF state where a main current does not flow, and when a voltage drop caused by the hole current flowing in the P-type base region 30 exceeds the built-in voltage between the emitter region 40 having a relatively high concentration (N$^+$) of N-type impurities and the P-type base region 30, a parasitic thyristor is turned into an ON state to come into a latch-up state in which a current continues to flow, resulting in a latch-up mode leading to a damage to the device.

In order to improve the latch-up resistance, it is necessary to reduce the current flowing through the base region 30 to reduce the voltage drop when the hole current flows through the base region 30.

In particular, since the built-in voltage is lowered in high temperature operation, the latch-up mode is likely to occur and the durability is lowered.

In the ON state, some of the holes implanted from the collector region 10 are blocked by the potential wall at the interface between the charge storage region 21 and the collector region 10, and are accumulated in the drift region 20. Then, the resistance of the drift region 20 is lowered.

On this occasion, since the Schottky connection is not applied with a voltage of 1.0 V or more and does not operate, the holes accumulated in the drift region 20 are not discharged from the Schottky connection to the emitter electrode 80. Therefore, the resistance of the drift region 20 is kept low.

In addition, forming the P-type charge extraction region 32 narrows the width when carriers pass through the junction field effect transistor (JFET) region, but since the JFET region has a concentration higher than that of the drift region 20 due to the charge storage region 21, the conductivity can be kept low.

In addition, since the structure having the Schottky connection is formed within the same cell as the base region 30, the integration of the elements is made more possible than the case of forming the rectifier element exemplified in Patent Document 1 outside the cell, for example. Therefore, the resistance per unit area can be reduced.

In the case of the conventional structure not having the charge extraction region 32 and the Schottky electrode 71, since a large electric field is applied to the gate insulating film 50 positioned in the center of the JFET in the OFF state, the possibility of device destruction is strong.

However, in the structure according to the present embodiment, since the P-type charge extraction region 32 and the Schottky electrode 71 are formed in the center of the JFET in place of the gate insulating film 50 and the gate electrode 60, the reliability of the gate insulating film 50 improves.

In addition, the depletion layer spreading from the charge extraction region 32 is connected to the depletion layer spreading from the base region 30 and spreads, and the electric field likely to concentrate at the corner between the lower surface and the side surface of the base region 30 is dispersed. As a result, the avalanche voltage can be increased.

In the turn-off transition period, in the structure formed of the wide band gap semiconductor according to the present embodiment, the built-in voltage of the PN junction formed at the interface between the emitter region 40 and the base region 30 is, for example, 2.5 V, and has a value larger than, for example, 1.0 V of the built-in voltage of the Schottky junction formed between the Schottky electrode 71 and the charge extraction region 32.

In the structure of the present embodiment, holes are generally discharged by the Schottky junction whose built-in voltage is lower than that of the PN junction. Since the PN junction and the Schottky connection are connected in parallel, the Schottky connection becomes conductive before a voltage of 2.5 V is applied to the PN junction. Therefore, a voltage of, for example, 1.0 V or more is not applied to the PN connection due to the voltage drop in the drift region 20 or the like. As a result, since the latch-up mode does not occur without the operation of the PN junction, the latch-up tolerance increases.

Second Embodiment

A wide band gap semiconductor device according to the present embodiment will be described. It should be noted that in the following description, the same components as those described in the embodiments described above are denoted by the same reference numerals and illustrated, and the detailed description thereof will be appropriately omitted.

<IGBT Configuration>

Figure 6:
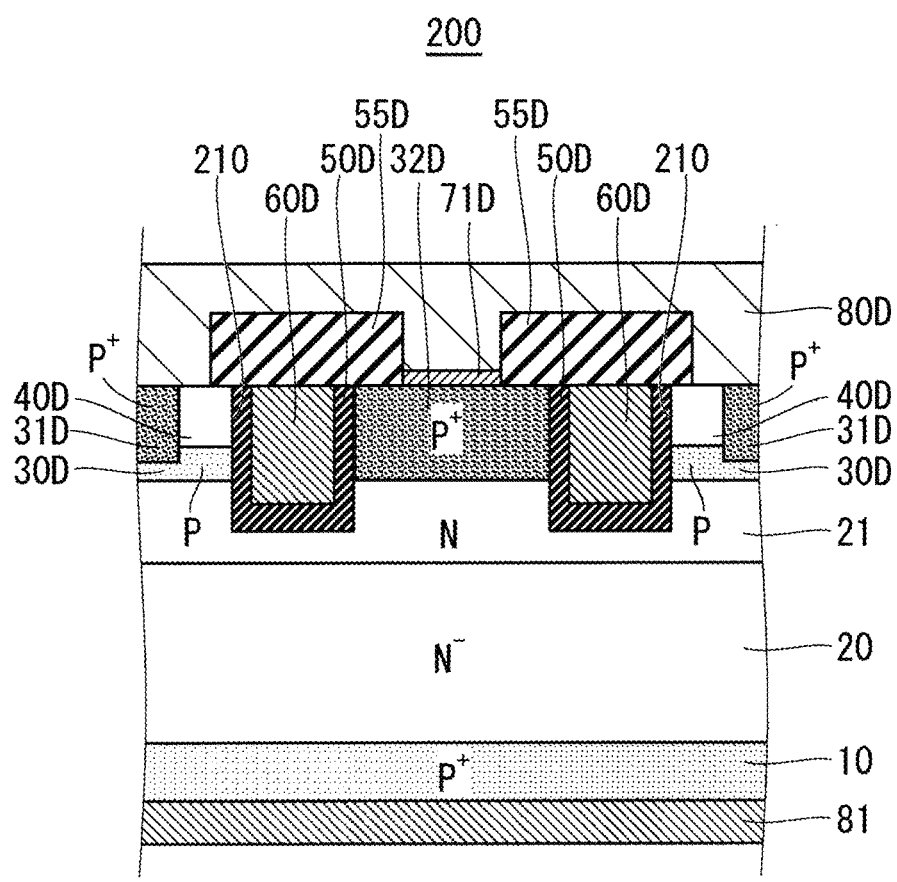
FIG. 6 is a cross-sectional view schematically showing an example of the configuration of the IGBT according to the embodiment.

FIG. 6 is a cross-sectional view schematically showing an example of the configuration of an IGBT 200 according to the present embodiment. As illustrated in FIG. 6, the IGBT 200 is similar in configuration to the IGBT 100 whose example is shown in the first embodiment.

As illustrated in FIG. 6, the IGBT 200 includes a collector region 10, a drift region 20, and a charge storage region 21.

In addition, in the present embodiment, a trench gate type SiC-IGBT in which the channel region is formed horizontally with respect to the thickness direction of the IGBT 200 (that is, the vertical direction in FIG. 6) will be described as an example.

In the surface layer of the charge storage region 21, a plurality of base regions 30D made of P-type wide band gap semiconductors are provided. In addition, in the surface layer of each of the base regions 30D, an emitter region 40D made of an N-type wide band gap semiconductor is formed.

A well contact region 31D made of a low-resistance P-type wide band gap semiconductor is formed inside each emitter region 40D.

In addition, in the surface layer of the charge storage region 21, a charge extraction region 32D made of a P-type wide band gap semiconductor in which a trench 210 is formed between the charge extraction region 32D and the base region 30D is formed.

It should be noted that the trench 210 is formed to reach a position deeper than the base region 30D from the upper surface of the emitter region 40D.

In addition, a gate insulating film 50D is formed in the trench 210 to cover the side surface of the base region 30D sandwiched between the charge storage region 21 and the emitter region 40D.

A Schottky electrode 71D is formed on the upper surface of the charge extraction region 32D. The Schottky electrode 71D is Schottky-connected to the P-type silicon carbide semiconductor layer (charge extraction region 32D).

The rising voltage when a forward voltage is applied to the Schottky connection is set to, for example, 0.2 V or more and 2.0 V or less. The rising voltage may be 1.0 V, for example.

In addition, the trench 210 is formed to penetrate the emitter region 40D from the upper surface of the emitter region 40D and further reach a position deeper than the lower surface of the base region 30D and the lower surface of the charge extraction region 32D. The gate insulating film 50D is formed in the trench 210.

The charge extraction region 32D is formed between the adjacent trenches 210. It should be noted that although the charge extraction region 32D in FIG. 6 is formed in contact with the trench 210, the charge extraction region 32D may be formed to be separated from the trench 210.

In addition, in the trench 210, a gate electrode 60D surrounded by the gate insulating film 50D is formed. In addition, an interlayer insulating film 55D is formed on the upper surface of the gate electrode 60D.

In addition, an emitter electrode 80D is formed to cover part of the upper surface of the opened emitter region 40D, the upper surface of the opened well contact region 31D, the upper surface of the opened Schottky electrode 71D, and the upper surface of the interlayer insulating film 55D.

The emitter electrode 80D is electrically connected to the emitter region 40D, the well contact region 31D, and the Schottky electrode 71D. The interlayer insulating film 55D is formed between the emitter electrode 80D and the gate electrode 60D. In addition, a collector electrode 81 is formed on the lower surface of the collector region 10.

In the structure of the present embodiment, holes are generally discharged by the Schottky junction whose built-in voltage is lower than that of the PN junction. Since the PN junction and the Schottky connection are connected in parallel, the Schottky connection becomes conductive before a voltage of 2.5 V is applied to the PN junction. Therefore, a voltage of 1.0 V or more is not applied to the PN connection due to the voltage drop in the drift region 20 or the like. As a result, since the latch-up mode does not occur without the operation of the PN junction, the latch-up tolerance increases.

In addition, according to the IGBT 200, the pitch per unit cell (cell pitch) can be reduced. Therefore, unit cells can be integrated with respect to a limited device area, and low on-resistance can be achieved in the ON state.

<Modification of IGBT>

Figure 7:
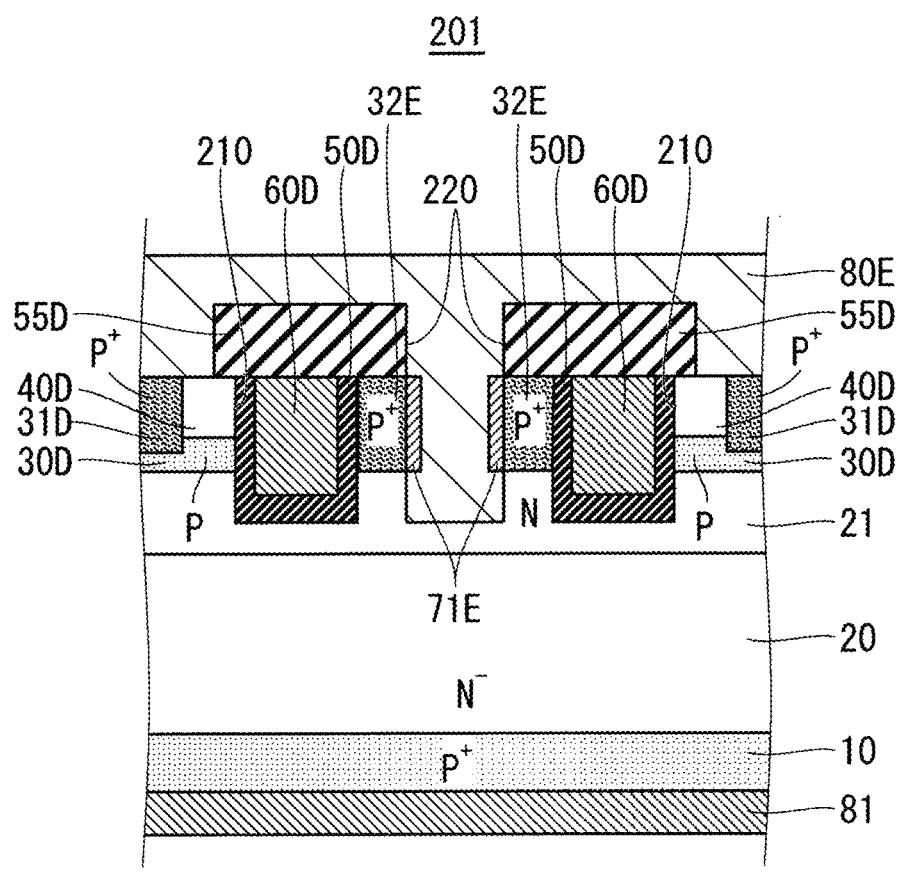
FIG. 7 is a cross-sectional view schematically showing an example of the configuration of the IGBT according to the embodiment.

FIG. 7 is a cross-sectional view schematically showing an example of the configuration of an IGBT 201 according to the present embodiment. As illustrated in FIG. 7, the IGBT 201 is similar in configuration to the IGBT 200 exemplified in the first embodiment.

As illustrated in FIG. 7, the IGBT 201 includes a collector region 10, a drift region 20, and a charge storage region 21.

In addition, in the present embodiment, a trench gate type SiC-IGBT in which the channel region is formed horizontally with respect to the thickness direction of the IGBT 201 (that is, the vertical direction in FIG. 7) will be described as an example.

In the surface layer of the charge storage region 21, a plurality of base regions 30D are provided. In addition, in the surface layer of each of the base regions 30D, an emitter region 40D is formed. In addition, a well contact region 31D is formed inside each emitter region 40D.

In addition, in the surface layer of the charge storage region 21, a charge extraction region 32E made of a P-type wide band gap semiconductor in which a trench 210 is formed between the charge extraction region 32E and the base region 30D is formed.

A Schottky electrode 71E is formed on the side surface of the charge extraction region 32E opposite to the trench 210. The Schottky electrode 71E is Schottky-connected to the P-type silicon carbide semiconductor layer (charge extraction region 32E).

The rising voltage when a forward voltage is applied to the Schottky connection is set to, for example, 0.2 V or more and 2.0 V or less. The rising voltage may be 1.0 V, for example.

In addition, the trench 210 is formed to penetrate the emitter region 40D from the upper surface of the charge storage region 21 and further reach a position deeper than the lower surface of the base region 30D and the lower surface of the charge extraction region 32E. A gate insulating film 50D is formed in the trench 210.

The charge extraction region 32E is formed between the adjacent trenches 210. It should be noted that although the charge extraction region 32E in FIG. 7 is formed in contact with the trench 210, the charge extraction region 32E may be formed to be separated from the trench 210.

In addition, in the trench 210, a gate electrode 60D surrounded by the gate insulating film 50D is formed. In addition, an interlayer insulating film 55D is formed on the upper surface of the gate electrode 60D.

In addition, an emitter electrode 80E is formed to cover part of the upper surface of the opened emitter region 40D, the upper surface of the opened well contact region 31D, the side surface of the opened Schottky electrode 71E, and the upper surface of the interlayer insulating film 55D.

The emitter electrode 80E is formed in a dummy trench 220 formed by penetrating the charge extraction region 32E from the upper surface of the charge extraction region 32E. Then, the Schottky electrode 71E is formed on the side surface of the charge extraction region 32E in the dummy trench 220.

The emitter electrode 80E is electrically connected to the emitter region 40D, the well contact region 31D, and the Schottky electrode 71E in the dummy trench 220. The interlayer insulating film 55D is formed between the emitter electrode 80E and the gate electrode 60D. In addition, a collector electrode 81 is formed on the lower surface of the collector region 10.

As illustrated in FIG. 7, in the IGBT 201, the Schottky electrode 71E is formed horizontally with respect to the thickness direction of the IGBT 201.

Therefore, the size (specifically, height, width, and depth) of the dummy trench 220 can be changed as appropriate. For example, the size of the dummy trench 220 may be the same as the size of the trench 210 including the gate electrode 60D.

In the structure of the present embodiment, holes are generally discharged by the Schottky junction whose built-in voltage is lower than that of the PN junction. Since the PN junction and the Schottky connection are connected in parallel, the Schottky connection becomes conductive before a voltage of 2.5 V is applied to the PN junction. Therefore, a voltage of 1.0 V or more is not applied to the PN connection due to the voltage drop in the drift region 20 or the like. As a result, since the latch-up mode does not occur without the operation of the PN junction, the latch-up tolerance increases.

In addition, according to the IGBT 201, the planar size of the charge extraction region 32E can be reduced. Therefore, the pitch per unit cell (cell pitch) can be reduced. As a result, unit cells can be integrated with respect to a limited device area, and low on-resistance can be achieved in the ON state.

Third Embodiment

A wide band gap semiconductor device and a method for manufacturing the wide band gap semiconductor device according to the present embodiment will be described. It should be noted that in the following description, the same components as those described in the embodiments described above are denoted by the same reference numerals and illustrated, and the detailed description thereof will be appropriately omitted.

<IGBT Configuration>

In the embodiment described above, the charge storage region 21 is formed on the entire upper surface of the drift region 20 by epitaxial growth. However, the formation mode of the charge storage region is not limited to this case.

FIG. 8 is a cross-sectional view schematically showing an example of the configuration of an IGBT 202 according to the present embodiment. As illustrated in FIG. 8, the IGBT 202 includes a collector region 10, a drift region 20, and a charge storage region 21F partially stacked on the upper surface of the drift region 20.

In the surface layer of the charge storage region 21F, a plurality of base regions 30 are provided. In addition, in the surface layer of each of the base regions 30, an emitter region 40 is formed. A well contact region 31 is formed inside each emitter region 40. In addition, a charge extraction region 32 is formed in the surface layer of the charge storage region 21F.

The charge storage regions 21F are formed, on the upper surface of the drift region 20, to sandwich an N-type separation region 22 in contact with directly below part of the charge extraction region 32. The impurity concentration of the N-type separation region 22 is equal to the impurity concentration of the drift region 20, for example.

An ohmic electrode 70 is formed across part of the upper surface of the emitter region 40 and part of the upper surface of the well contact region 31. In addition, a Schottky electrode 71 is formed on the upper surface of the charge extraction region 32.

The rising voltage when a forward voltage is applied to the Schottky connection is set to, for example, 0.2 V or more and 2.0 V or less. The rising voltage may be 1.0 V, for example.

In addition, a gate insulating film 50 is formed across the upper surface of the base region 30 and the upper surface of the charge extraction region 32. In addition, a gate electrode 60 is formed at a position where the gate insulating film 50 overlaps the base region 30 in a plan view with the gate insulating film 50 interposed therebetween. In addition, an interlayer insulating film 55 is formed to cover the gate electrode 60.

In addition, an emitter electrode 80 is formed to cover the upper surface of the opened ohmic electrode 70, the upper surface of the opened Schottky electrode 71, and the upper surface of the interlayer insulating film 55. In addition, a collector electrode 81 is formed on the lower surface of the collector region 10.

<IGBT Manufacturing Method>

Of the methods for manufacturing the IGBT, in particular, the method for forming the charge storage region 21F is not limited to the epitaxial growth.

For example, an implantation mask is formed at a place where the N-type separation region 22 is to be formed by photoresist or the like on the upper surface of the drift region 20. Then, N having N-type impurities is ion-implanted. On this occasion, the depth of N ion implantation is assumed to be, for example, 1.0 µm or more and 3 µm or less. Then, the implantation mask is removed.

By the step, the region into which N ions have been implanted serves as the charge storage region 21F, and the region into which N ions have not been implanted serves as the N-type separation region 22.

In the turn-off transition period, when dV/dt is extremely large, for example, a voltage drop of 2.5 V or more may occur at the PN junction formed at the interface between the emitter region 40 and the base region 30 of the structure illustrated in FIG. 1, and the latch-up mode may occur.

On the other hand, according to the present embodiment, forming the N-type separation region 22 directly below part of the charge extraction region 32 reduces the potential wall at the interface between the drift region 20 and the charge storage region 21F. Therefore, since a large number of holes flow to the Schottky connection in the turn-off transition period, the latch-up tolerance can be increased.

Fourth Embodiment

A wide band gap semiconductor device according to the present embodiment will be described. It should be noted that in the following description, the same components as those described in the embodiments described above are denoted by the same reference numerals and illustrated, and the detailed description thereof will be appropriately omitted.

<IGBT Configuration>

FIG. 9 is a plan view schematically showing an example of the configuration of the semiconductor device according to the present embodiment when the upper electrode and the dielectric film to be formed after the semiconductor element is formed are omitted.

As illustrated in FIG. 9, in an IGBT 300, an emitter region 40 is formed to surround a well contact region 31. In addition, a base region 30 is formed to surround the emitter region 40. In addition, a charge storage region 21 is formed to surround the base region 30.

The respective cell regions thus formed are formed to be separated from each other. Then, the respective cell regions are two-dimensionally arranged in the left-right direction and the up-down direction in FIG. 9.

In FIG. 9, a charge extraction region 32G is formed in a region where the cell region is not formed. The respective charge extraction regions 32G are formed in a region extending in the left-right direction where the cell region is not formed and a region extending in the up-down direction where the cell region is not formed, excluding in the intersection region of the region extending in the left-right direction where the cell region is not formed and the region extending in the up-down direction where the cell region is not formed.

In FIG. 9, the charge extraction region 32G is formed between the cell regions positioned closest to each other (that is, between the upper and lower cell regions in FIG. 9, and between the left and right cell regions in FIG. 9), whereas the charge extraction region 32G is not formed between cell regions diagonally positioned in a plan view.

Figure 10:
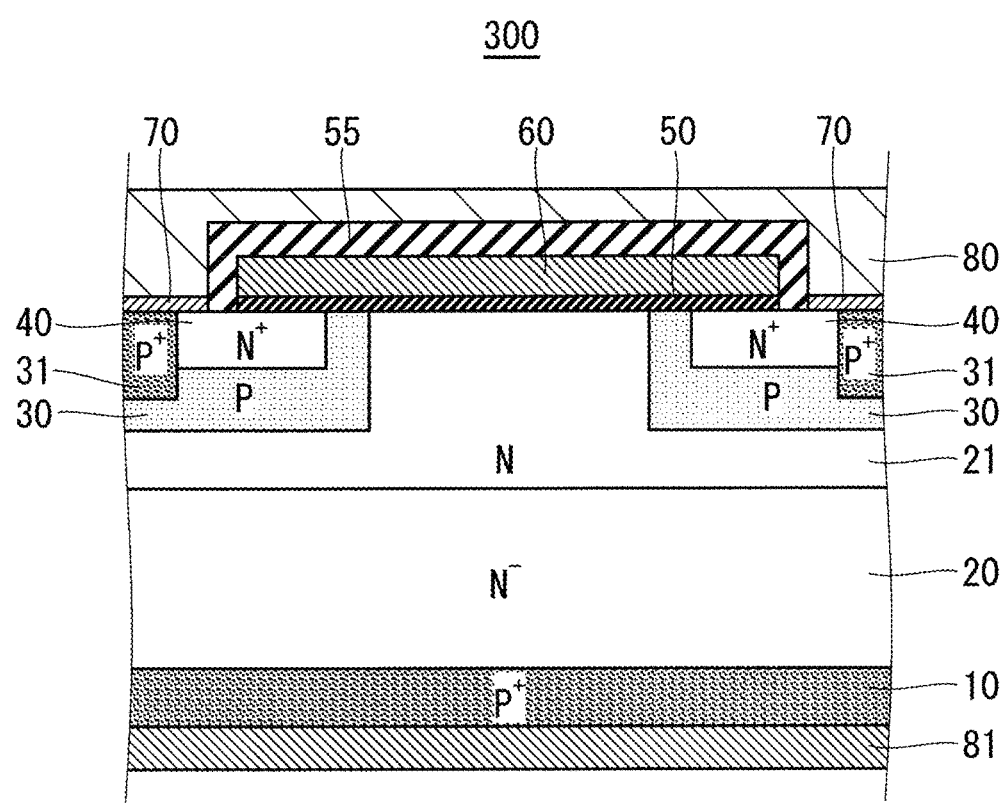
FIG. 10 is a cross-sectional view schematically showing an example of the configuration of the IGBT according to the embodiment.

FIG. 10 is a cross-sectional view schematically showing an example of the configuration of the IGBT 300 according to the present embodiment. FIG. 10 corresponds to the B-B' cross section in FIG. 9. It should be noted that the cross-sectional view taken along the line A-A' in FIG. 9 is similar to the structure shown in FIG. 1 in which the charge extraction region 32 is replaced with the charge extraction region 32G.

As illustrated in FIG. 10, the IGBT 300 includes a collector region 10, a drift region 20, and the charge storage region 21.

In the surface layer of the charge storage region 21, a plurality of base regions 30 are provided. In addition, in the surface layer of each of the base regions 30, the emitter region 40 is formed.

The well contact region 31 is formed inside each emitter region 40. An ohmic electrode 70 is formed across part of the upper surface of the emitter region 40 and part of the upper surface of the well contact region 31.

In addition, a gate insulating film 50 is formed over the upper surface of the base region 30. In addition, a gate electrode 60 is formed at a position where the gate insulating film 50 overlaps the base region 30 in a plan view with the gate insulating film 50 interposed therebetween. In addition, an interlayer insulating film 55 is formed to cover the gate electrode 60.

In addition, an emitter electrode 80 is formed to cover the upper surface of the opened ohmic electrode 70 and the upper surface of the interlayer insulating film 55.

The emitter electrode 80 is electrically connected to the ohmic electrode 70. The interlayer insulating film 55 is formed between the emitter electrode 80 and the gate electrode 60. In addition, a collector electrode 81 is formed on the lower surface of the collector region 10.

Limiting the region where the charge extraction region 32G is formed to only between the cell regions positioned closest to each other (that is, in the vicinity of the base region 30 in FIG. 9) widens the width of the path when carriers pass through the JFET region in the ON state. Therefore, the resistance of the JFET can be reduced.

In the turn-off transition period, the presence or absence of occurrence of the latch-up mode is affected by the magnitude of the current flowing in the base region 30, but according to the structure of the present embodiment, since the charge extraction region 32G is formed near the base region 30, the amount of holes flowing to the base region 30 can be reduced. Therefore, the latch-up tolerance can be increased.

Fifth Embodiment

A wide band gap semiconductor device according to the present embodiment will be described. It should be noted that in the following description, the same components as those described in the embodiments described above are denoted by the same reference numerals and illustrated, and the detailed description thereof will be appropriately omitted.

<IGBT Configuration>

FIG. 11 is a plan view schematically showing an example of the configuration of the semiconductor device according to the present embodiment when the upper electrode and the dielectric film to be formed after the semiconductor element is formed are omitted.

As illustrated in FIG. 11, in an IGBT 400, an emitter region 40 is formed to surround a well contact region 31. In addition, a base region 30 is formed to surround the emitter region 40. In addition, a charge storage region 21 is formed to surround the base region 30.

The respective cell regions thus formed are formed to be separated from each other. Then, the respective cell regions are two-dimensionally arranged in the left-right direction and the up-down direction in FIG. 11.

In FIG. 11, a charge extraction region 32H is formed in a region where the cell region is not formed. The charge extraction region 32H is formed in each of the laterally extending region in which the cell region is not formed and the vertically extending region in which the cell region is not formed.

Here, the charge extraction region 32H has a smaller area in a plan view of the region to be formed than the charge extraction region 32 in FIG. 2, for example. Specifically, the charge extraction region 32H is formed only in part in the width direction of the region extending in the left-right direction in which the cell region is not formed, and is a region narrower in width than the charge extraction region 32 in FIG. 2. Similarly, the charge extraction region 32H is formed only in part in the width direction of the region extending in the up-down direction in which the cell region is not formed, and is a region narrower in width than the charge extraction region 32 in FIG. 2.

It should be noted that the area of the region where the charge extraction region 32H is formed is assumed to be, for example, 0.05 times or more and 0.5 times or less the sum of the areas of the base region 30, the emitter region 40, and the well contact region 31.

Figure 12:
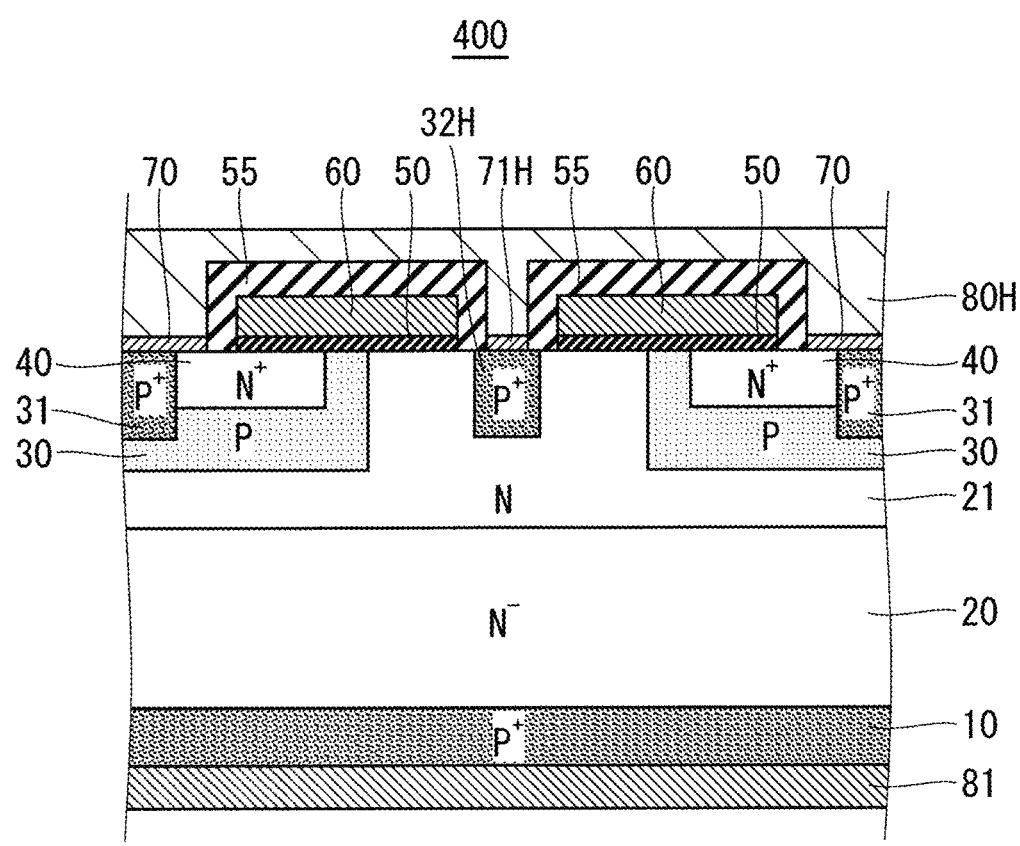
FIG. 12 is a cross-sectional view schematically showing an example of the configuration of the IGBT according to the embodiment.

FIG. 12 is a cross-sectional view schematically showing an example of the configuration of the IGBT 400 according to the present embodiment. FIG. 12 corresponds to the A-A' cross section in FIG. 11.

As illustrated in FIG. 12, the IGBT 400 includes a collector region 10, a drift region 20, and a charge storage region 21.

In the surface layer of the charge storage region 21, a plurality of base regions 30 are provided. In addition, in the surface layer of each of the base regions 30, the emitter region 40 is formed. The well contact region 31 is formed inside each emitter region 40.

In addition, in the surface layer of the charge storage region 21, a charge extraction region 32H made of a P-type wide band gap semiconductor is formed to be separated from the base region 30.

An ohmic electrode 70 is formed across part of the upper surface of the emitter region 40 and part of the upper surface of the well contact region 31. A Schottky electrode 71H is formed on the upper surface of the charge extraction region 32H. The Schottky electrode 71H is Schottky-connected to the P-type silicon carbide semiconductor layer (charge extraction region 32H).

The rising voltage when a forward voltage is applied to the Schottky connection is set to, for example, 0.2 V or more and 2.0 V or less. The rising voltage may be 1.0 V, for example.

In addition, a gate insulating film 50 is formed across the upper surface of the base region 30 and the upper surface of the charge extraction region 32H. In addition, a gate electrode 60 is formed at a position where the gate insulating film 50 overlaps the base region 30 in a plan view with the gate insulating film 50 interposed therebetween. In addition, an interlayer insulating film 55 is formed to cover the gate electrode 60.

In addition, an emitter electrode 80H is formed to cover the upper surface of the opened ohmic electrode 70, the upper surface of the opened Schottky electrode 71H, and the upper surface of the interlayer insulating film 55.

The emitter electrode 80H is electrically connected to the ohmic electrode 70 and the Schottky electrode 71H. The interlayer insulating film 55 is formed between the emitter electrode 80H and the gate electrode 60. In addition, a collector electrode 81 is formed on the lower surface of the collector region 10.

The area in a plan view of the region where the charge extraction region 32H is to be formed is smaller than, for example, that of the charge extraction region 32 in FIG. 2, whereby the width of the path when carriers pass through the JFET region in the ON state is widened. Therefore, the resistance of the JFET can be reduced.

In addition, since there is a large difference in built-in voltage between the PN junction and the Schottky junction, even if the area of the region where the Schottky electrode 71H is formed in a plan view is smaller than the area of the region where the ohmic electrode 70 is formed in a plan view, the effect of increasing the latch-up tolerance can be obtained in the turn-off transition period.

Sixth Embodiment

A wide band gap semiconductor device according to the present embodiment will be described. It should be noted that in the following description, the same components as those described in the embodiments described above are denoted by the same reference numerals and illustrated, and the detailed description thereof will be appropriately omitted.

Figure 13:
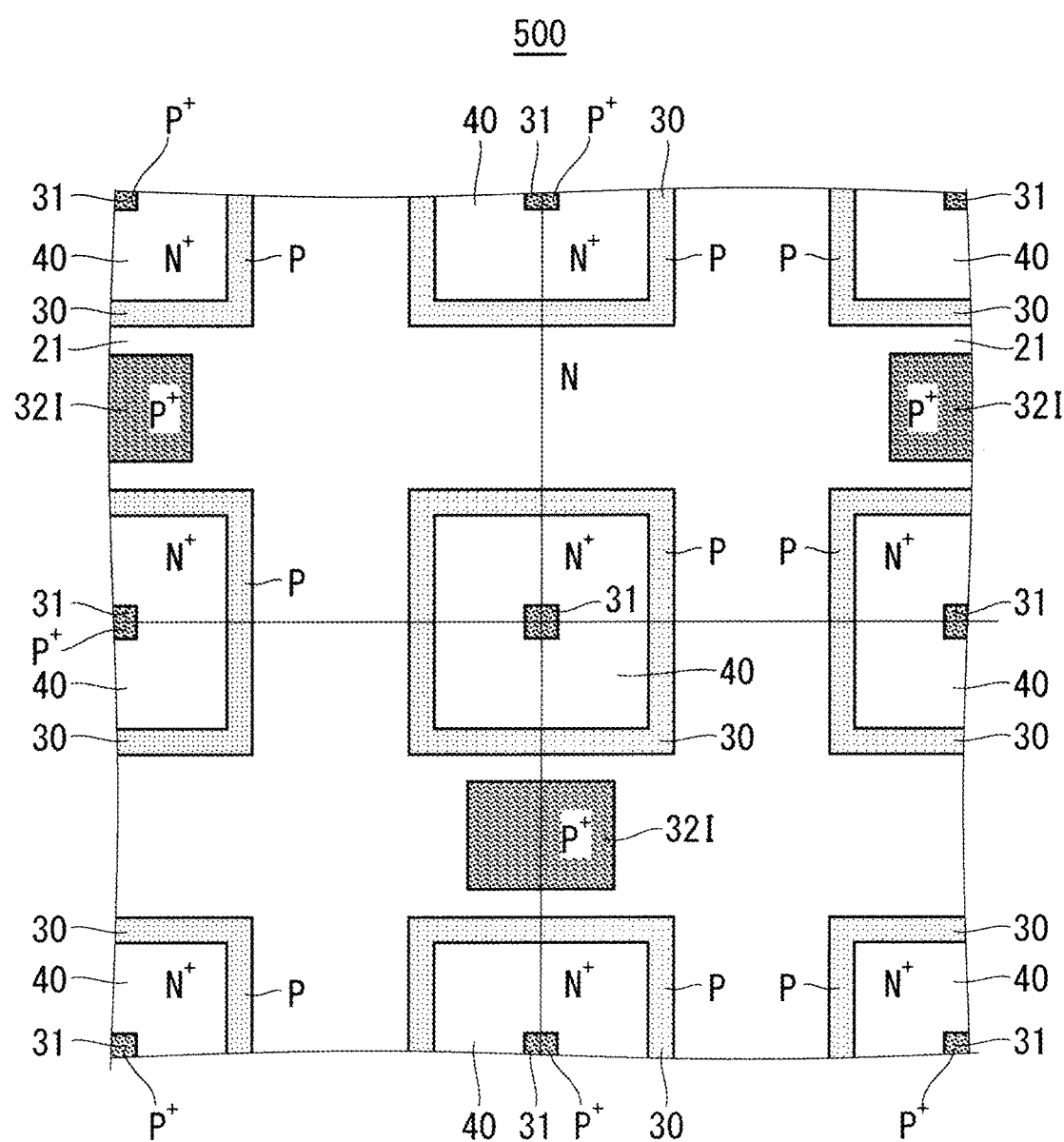
FIG. 13 is a plan view schematically showing an example of the configuration of the semiconductor device according to the embodiment when the upper electrode and the dielectric film to be formed after the semiconductor element is formed are omitted.

<IGBT Configuration>
FIG. 13 is a plan view schematically showing an example of the configuration of the semiconductor device according to the present embodiment when the upper electrode and the dielectric film to be formed after the semiconductor element is formed are omitted.

As illustrated in FIG. 13, in an IGBT 500, an emitter region 40 is formed to surround a well contact region 31. In addition, a base region 30 is formed to surround the emitter region 40. In addition, a charge storage region 21 is formed to surround the base region 30.

The respective cell regions thus formed are formed to be separated from each other. Then, the respective cell regions are two-dimensionally arranged in the left-right direction and the up-down direction in FIG. 13.

In FIG. 13, a charge extraction region 32I is formed in a region where the cell region is not formed. The respective charge extraction regions 32I are formed in part of region extending in the left-right direction where the cell region is not formed and part of a region extending in the up-down direction where the cell region is not formed, excluding in the intersection region of the region extending in the left-right direction where the cell region is not formed and the region extending in the up-down direction where the cell region is not formed.

In FIG. 13, the charge extraction region 32I is formed between the cell regions positioned closest to each other (that is, between the upper and lower cell regions in FIG. 13, and between the left and right cell regions in FIG. 13), whereas the charge extraction region 32I is not formed between cell regions diagonally positioned in a plan view.

Furthermore, the charge extraction region 32I is formed only in some of places between cell regions positioned closest to each other, and is not formed in all the places between cell regions positioned closest to each other.

The charge extraction region 32I is formed only in some of places between cell regions positioned closest to each other, whereby the width of the path when carriers pass through the JFET region in the ON state is widened. Therefore, the resistance of the JFET can be reduced.

In addition, since there is a large difference in built-in voltage between the PN junction and the Schottky junction, even if the area of the region where the charge extraction region 32I in a plan view is formed is small, the effect of increasing the latch-up tolerance can be obtained in the turn-off transition period.

Seventh Embodiment

A wide band gap semiconductor device according to the present embodiment will be described. It should be noted that in the following description, the same components as those described in the embodiments described above are denoted by the same reference numerals and illustrated, and the detailed description thereof will be appropriately omitted.

Figure 14:
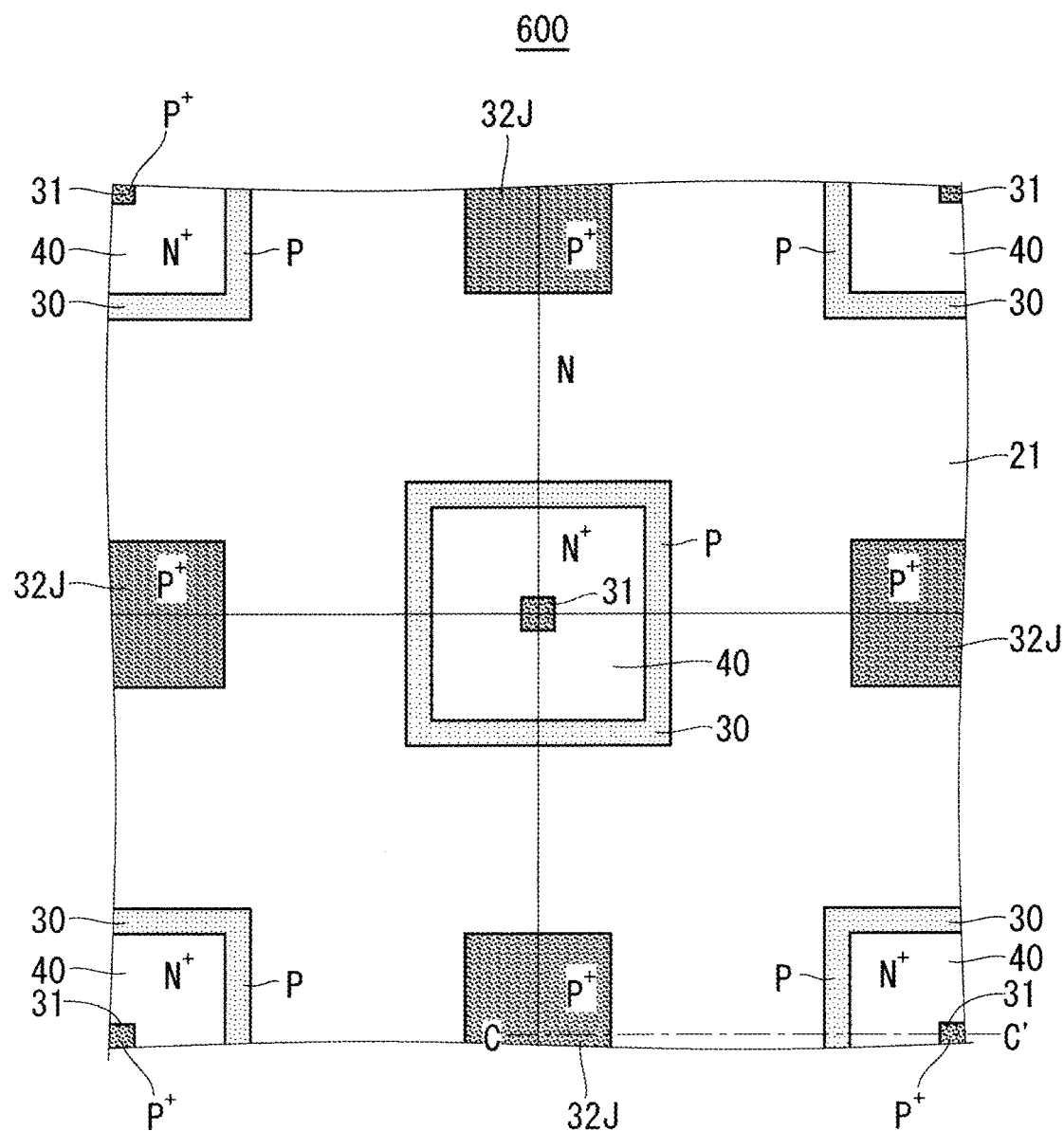
FIG. 14 is a plan view schematically showing an example of the configuration of the semiconductor device according to the embodiment when the upper electrode and the dielectric film to be formed after the semiconductor element is formed are omitted.

<IGBT Configuration>
FIG. 14 is a plan view schematically showing an example of the configuration of the semiconductor device according to the present embodiment when the upper electrode and the dielectric film to be formed after the semiconductor element is formed are omitted.

As illustrated in FIG. 14, in an IGBT 600, an emitter region 40 is formed to surround a well contact region 31. In addition, a base region 30 is formed to surround the emitter region 40. In addition, a charge storage region 21 is formed to surround the base region 30. The respective cell regions thus formed are two-dimensionally arranged to be separated from each other, and a charge extraction region 32J is partially formed in the region between the cell regions.

The charge extraction region 32J is arranged in a place where a cell region is to be formed in place of the cell region. In FIG. 14, cell regions and charge extraction regions 32J are alternately arranged in the up-down direction and the left-right direction in FIG. 14.

FIG. 15 is a cross-sectional view schematically showing an example of the configuration of the IGBT 600 according to the present embodiment. FIG. 15 corresponds to the C-C' cross section in FIG. 14.

As illustrated in FIG. 15, the IGBT 600 includes a collector region 10, a drift region 20, and the charge storage region 21.

In the surface layer of the charge storage region 21, the base region 30 is provided. In addition, in the surface layer of the base region 30, the emitter region 40 is formed. A well contact region 31 is formed inside the emitter region 40.

In addition, in the surface layer of the charge storage region 21, a charge extraction region 32J made of a P-type wide band gap semiconductor is formed to be separated from the base region 30.

An ohmic electrode 70 is formed across part of the upper surface of the emitter region 40 and part of the upper surface of the well contact region 31. A Schottky electrode 71J is formed on the upper surface of the charge extraction region 32J. The Schottky electrode 71J is Schottky-connected to the P-type silicon carbide semiconductor layer (charge extraction region 32J).

The rising voltage when a forward voltage is applied to the Schottky connection is set to, for example, 0.2 V or more and 2.0 V or less. The rising voltage may be 1.0 V, for example.

In addition, a gate insulating film 50 is formed across the upper surface of the base region 30 and the upper surface of the charge extraction region 32J. In addition, a gate electrode 60 is formed at a position where the gate insulating film 50 overlaps the base region 30 in a plan view with the gate insulating film 50 interposed therebetween. In addition, an interlayer insulating film 55 is formed to cover the gate electrode 60.

In addition, an emitter electrode 80J is formed to cover the upper surface of the opened ohmic electrode 70, the upper surface of the opened Schottky electrode 71J, and the upper surface of the interlayer insulating film 55.

The emitter electrode 80J is electrically connected to the ohmic electrode 70 and the Schottky electrode 71J. An interlayer insulating film 55 is formed between the emitter electrode 80J and the gate electrode 60. In addition, a collector electrode 81 is formed on the lower surface of the collector region 10.

Eighth Embodiment

A power conversion apparatus and a method for manufacturing the power conversion apparatus according to the present embodiment will be described. In the following description, the same components as those described in the embodiments described above are denoted by the same reference numerals and illustrated, and the detailed description thereof will be appropriately omitted.

<Configuration of Power Conversion Apparatus>

The present embodiment is obtained by applying the semiconductor device according to any of the above-described embodiments to a power conversion apparatus. The power conversion apparatus to be applied is not limited to one for a specific use, but in the following, a case where the power conversion apparatus is applied to a three-phase inverter will be described.

Figure 16:
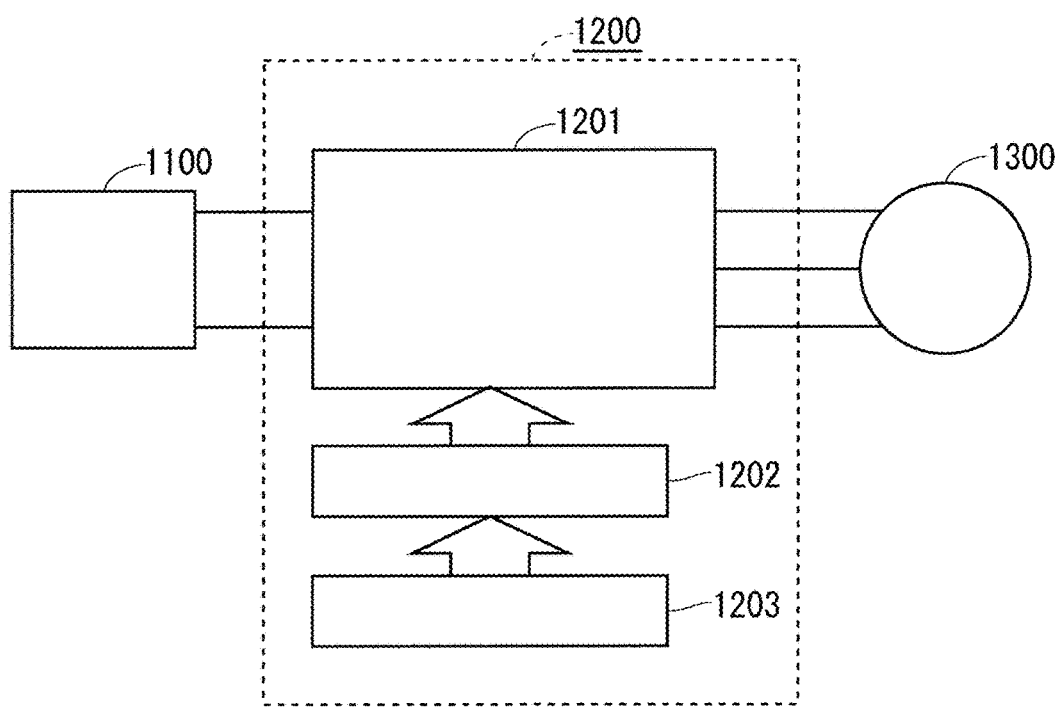
FIG. 16 is a diagram conceptually showing an example of the configuration of a power conversion system including the power conversion apparatus according to the embodiment.

FIG. 16 is a diagram conceptually showing an example of the configuration of a power conversion system including the power conversion apparatus according to the present embodiment.

As illustrated in FIG. 16, the power conversion system includes a power supply 1100, a power conversion apparatus 1200, and a load 1300. The power supply 1100 is a DC power supply, and supplies DC power to the power conversion apparatus 1200. The power supply 1100 can include various things, such as a DC system, a solar cell, a storage battery, or the like. In addition, the power supply 1100 can include a rectifier circuit connected to an AC system, an AC-DC converter, or the like. In addition, the power supply 1100 may include a DC-DC converter for converting DC power output from the DC system into predetermined power.

The power conversion apparatus 1200 is a three-phase inverter connected between the power supply 1100 and the load 1300. The power conversion apparatus 1200 converts the DC power supplied from the power supply 1100 into AC power, and further supplies the AC power to the load 1300.

In addition, as illustrated in FIG. 16, the power conversion apparatus 1200 includes a conversion circuit 1201 for converting DC power into AC power to output the converted power, a drive circuit 1202 for outputting a drive signal for driving each switching element of the conversion circuit 1201, and a control circuit 1203 for outputting a control signal for controlling the drive circuit 1202 to the drive circuit 1202.

The load 1300 is a three-phase electric motor driven by AC power supplied from the power conversion apparatus 1200. It should be noted that the load 1300 is not limited to a specific use, and is an electric motor to be mounted on various electric apparatuses, and is used as, for example, a hybrid vehicle, an electric vehicle, a railway vehicle, an elevator, or an electric motor for an air conditioner.

Hereinafter, details of the power conversion apparatus 1200 will be described. The conversion circuit 1201 includes a switching element and a freewheeling diode (not shown here). Then, the switching element performs switching operation to convert the DC power supplied from the power supply 1100 into AC power, and further supplies the AC power to the load 1300.

There are various specific circuit configurations of the conversion circuit 1201, and the conversion circuit 1201 according to the present embodiment is a two-level three-phase full bridge circuit and includes six switching elements and six freewheeling diodes connected antiparallel to the respective switching elements.

The semiconductor device according to any one of the above-described embodiments is applied to at least one of each switching element and each freewheeling diode in the conversion circuit 1201. The six switching elements are connected in series for every two switching elements to constitute upper and lower arms, and the respective upper and lower arms constitute each phase (that is, U phase, V phase, and W phase) of the full bridge circuit. Then, the output terminals of the respective upper and lower arms, that is, the three output terminals of the conversion circuit 1201, are connected to the load 1300.

The drive circuit 1202 generates drive signals for driving the switching elements of the conversion circuit 1201, and further supplies the drive signals to the control electrodes of the switching elements of the conversion circuit 1201. Specifically, based on a control signal output from a control circuit 1203 described below, a drive signal to turn the switching element into the ON state and a drive signal to turn the switching element into the OFF state are output to the control electrodes of the respective switching elements.

When the switching element is maintained in the ON state, the drive signal is a voltage signal not less than the threshold voltage of the switching element (that is, ON signal), and when the switching element is maintained in the OFF state, the drive signal is a voltage signal not more than the threshold voltage of the switching element (that is, OFF signal).

The control circuit 1203 controls the switching elements of the conversion circuit 1201 so that desired power is supplied to the load 1300. Specifically, based on the power to be supplied to the load 1300, the time required for each switching element of the conversion circuit 1201 to be turned on (that is, ON time) is calculated. For example, the conversion circuit 1201 can be controlled by PWM control for modulating the ON time of the switching element according to the voltage to be output.

Then, the control circuit 1203 outputs a control instruction (that is, control signal) to the drive circuit 1202 so that, at each time point, the ON signal is output to the switching element to be turned on and the OFF signal is output to the switching element to be turned off. The drive circuit 1202 outputs an ON signal or an OFF signal as a drive signal to the control electrode of each switching element based on the control signal.

In the power conversion apparatus 1200 according to the present embodiment, since the semiconductor device according to any one of the embodiments described above is applied as the switching element of the conversion circuit 1201, it is possible to stabilize the on-resistance after going through the energization cycle.

It should be noted that in the present embodiment, an example in which the semiconductor device according to any one of the embodiments described above is applied to a two-level three-phase inverter has been described, but the application example is not limited to this. The semiconductor device according to any one of the above-described embodiments can be applied to various power conversion apparatuses.

In addition, although a two-level power conversion apparatus has been described in the present embodiment, the semiconductor device according to any one of the above-described embodiments may be applied to a three-level or multi-level power conversion apparatus. In addition, when power is supplied to a single-phase load, the semiconductor device according to any one of the embodiments described above may be applied to a single-phase inverter.

In addition, in the case of supplying power to a DC load or the like, the semiconductor device according to any one of the embodiments described above can also be applied to the DC-DC converter or the AC-DC converter.

In addition, the power conversion apparatus to which the semiconductor device according to any one of the above-described embodiments is applied is not limited to the case where the load described above is an electric motor, and can also be used as a power supply apparatus for, for example, an electric discharge machine, a laser beam machine, an induction heating cooker, or a noncontact power feeding system. In addition, the power conversion apparatus to which the semiconductor device according to any one of the above-described embodiments is applied can also be used as a power conditioner in a solar power generation system, a power storage system, or the like.

Effects Produced by Embodiments Described Above

Next, examples of effects produced by the above-described embodiments will be shown. It should be noted that in the following description, the effect is described based on the specific configuration exemplified in the above-described embodiments, but in the scope where the same effect is produced, the configuration may be replaced with other specific configurations exemplified in the specification of the present application.

In addition, the replacement may be performed across a plurality of embodiments. That is, the case may be used where the same effects are produced by combining the respective configurations exemplified in different embodiments.

According to the embodiments described above, the wide band gap semiconductor device includes: a drift region 20 made of a wide band gap semiconductor (for example, silicon carbide) of the first conductivity type (that is, N type), a collector region 10 made of a wide band gap semiconductor of the second conductivity type (that is, P type) formed on the lower surface of the drift region 20, a charge storage region 21 made of an N-type wide band gap semiconductor, a P-type base region 30, a P-type charge extraction region 32, an N-type emitter region 40, a Schottky electrode 71, a gate insulating film 50, a gate electrode 60, an emitter electrode 80, and a collector electrode 81. The charge storage region 21 is formed on the upper surface of the drift region 20. In addition, the charge storage region 21 has a higher impurity concentration than the drift region 20. The base region 30 is partially formed in the surface layer of the charge storage region 21. The charge extraction region 32 is formed to be separated from the base region 30 in the surface layer of the charge storage region 21. In addition, the charge extraction region 32 has a higher impurity concentration than the base region 30. The emitter region 40 is partially formed in the surface layer of the base region 30. In addition, the emitter region 40 has a higher impurity concentration than the charge storage region 21. The Schottky electrode 71 is formed in contact with the charge extraction region 32. In addition, the Schottky electrode 71 is Schottky-connected to the charge extraction region 32. The gate insulating film 50 is formed in contact with the base region 30 at a position sandwiched between the charge storage region 21 and the emitter region 40. The gate electrode 60 is formed in contact with the gate insulating film 50. The emitter electrode 80 is formed to cover the Schottky electrode 71 and the emitter region 40. The collector electrode 81 is formed on the lower surface of the collector region 10.

According to this configuration, since the Schottky connection conducts at a voltage lower than that of the PN connection at the interface between the base region and the emitter region, a voltage not less than the built-in voltage is not applied to the PN junction. As a result, the latch-up tolerance is increased, and the reliability of the wide band gap semiconductor device is improved. In addition, since the structure having the Schottky connection is formed in the same cell as the base region 30, the elements can be integrated. Therefore, the resistance per unit area can be reduced.

It should be noted that other configurations exemplified in the specification of the present application other than these configurations can be appropriately omitted. That is, if at least these configurations are provided, the effects described above can be produced.

However, even when at least one of the other configurations exemplified in the specification of the present application is appropriately added to the configurations described above, that is, even when other configurations exemplified in the specification of the present application but not mentioned as the configurations described above are added, similar effects can be produced.

In addition, according to the embodiments described above, the built-in voltage of the Schottky barrier diode formed between the Schottky electrode 71 and the charge extraction region 32 is lower than the built-in voltage of the diode formed between the base region 30 and the emitter region 40. According to this configuration, since the PN junction and the Schottky connection are connected in parallel, the Schottky connection becomes conductive before the voltage of 2.5 V is applied to the PN junction. Therefore, a voltage of, for example, 1.0 V or more is not applied to the PN connection due to the voltage drop in the drift region 20 or the like. As a result, since the latch-up mode does not occur without the operation of the PN junction, the latch-up tolerance increases.

In addition, according to the embodiments described above, the wide band gap semiconductor device includes the N-type separation region 22 formed in contact with the lower surface of part of the charge extraction region 32. Then, the impurity concentration of the separation region 22 is equal to that of the drift region 20. According to this configuration, forming the N-type separation region 22 directly below part of the charge extraction region 32 reduces the potential wall at the interface between the drift region 20 and the charge storage region 21F. Therefore, since a large number of holes flow to the Schottky connection in the turn-off transition period, the latch-up tolerance can be increased.

In addition, according to the embodiments described above, a plurality of base regions 30 are arranged in the surface layer of the charge storage region 21 in a plan view. In addition, the plurality of base regions 30 are two-dimensionally arranged in the first direction and the second direction orthogonal to the first direction in a plan view. In addition, when a region, extending in the first direction, in which the base region is not arranged is assumed to be a first region, and a region, extending in the second direction, in which the base region is not arranged is assumed to be a second region, the charge extraction region 32 is formed in the first region and the second region in a plan view. According to this configuration, since the Schottky connection conducts at a voltage lower than that of the PN connection at the interface between the base region and the emitter region, a voltage not less than the built-in voltage is not applied to the PN junction. As a result, the latch-up tolerance is increased, and the reliability of the wide band gap semiconductor device is improved.

In addition, according to the embodiments described above, the charge extraction region 32H is formed in part of the first region in the width direction and part of the second region in the width direction in a plan view. According to this configuration, the area in a plan view of the region where the charge extraction region 32H is to be formed is smaller than, for example, that of the charge extraction region 32 in FIG. 2, whereby the width of the path when carriers pass through the JFET region in the ON state is widened.

In addition, according to the embodiments described above, the wide band gap semiconductor device includes the P-type well contact region 31 formed to reach the base region 30 from the upper surface of the emitter region 40. Then, the area of the charge extraction region 32H in a plan view is 0.05 times or more and 0.5 times or less the sum of the area of the base region 30, the area of the emitter region 40, and the area of the well contact region 31 in a plan view. According to this configuration, the area in a plan view of the region where the charge extraction region 32H is to be formed is smaller than, for example, that of the charge extraction region 32 in FIG. 2, whereby the width of the path when carriers pass through the JFET region in the ON state is widened. Therefore, the resistance of the JFET can be reduced. In addition, since there is a large difference in built-in voltage between the PN junction and the Schottky junction, even if the area of the region where the Schottky electrode 71H is formed in a plan view is smaller than the area of the region where the ohmic electrode 70 is formed in a plan view, the effect of increasing the latch-up tolerance can be obtained in the turn-off transition period.

In addition, according to the embodiments described above, when a region in which a first region where the base region is not arranged, extending in the first direction intersects a second region where the base region is not arranged, extending in the second direction is assumed to be an intersection region, the charge extraction region 32G is formed in the first region and the second region except the intersection region in a plan view. According to this configuration, limiting the region where the charge extraction region 32G is formed to only between the cell regions positioned closest to each other (that is, in the vicinity of the base region 30 in FIG. 9) widens the width of the path when carriers pass through the JFET region in the ON state. Therefore, the resistance of the JFET can be reduced. In the turn-off transition period, the presence or absence of occurrence of the latch-up mode is affected by the magnitude of the current flowing in the base region 30, but according to this structure, since the charge extraction region 32G is formed near the base region 30, the amount of holes flowing to the base region 30 can be reduced. Therefore, the latch-up tolerance can be increased.

In addition, according to the embodiments described above, the charge extraction region 32I is formed in part of the first region and part of the second region except the intersection region in a plan view. According to this configuration, the width when carriers pass through the JFET region in the ON state is increased. Therefore, the resistance of the JFET can be reduced. In addition, since there is a large difference in built-in voltage between the PN junction and the Schottky junction, even if the area of the region where the charge extraction region 32I in a plan view is formed is small, the effect of increasing the latch-up tolerance can be obtained in the turn-off transition period.

In addition, according to the embodiments described above, a plurality of base regions 30 are arranged in the surface layer of the charge storage region 21 in a plan view. In addition, the plurality of base regions 30 are two-dimensionally arranged in the first direction and the second direction orthogonal to the first direction in a plan view. Then, the charge extraction region 32J is formed to be replaced by some of the plurality of base regions 30 to be arranged. According to this configuration, since the Schottky connection conducts at a voltage lower than that of the PN connection at the interface between the base region and the emitter region, a voltage not less than the built-in voltage is not applied to the PN junction. As a result, the latch-up tolerance is increased, and the reliability of the wide band gap semiconductor device is improved.

In addition, according to the embodiments described above, the wide band gap semiconductor device includes a trench 210 formed to reach a position deeper than the base region 30D from the upper surface of the emitter region 40D. Then, the gate insulating film 50D is formed in the trench 210 to cover the side surface of the base region 30D sandwiched between the charge storage region 21 and the emitter region 40D. In addition, the gate electrode 60D is formed to be surrounded by the gate insulating film 50D in the trench 210. According to this configuration, the pitch per unit cell (cell pitch) can be reduced. Therefore, unit cells can be integrated with respect to a limited device area, and low on-resistance can be achieved in the ON state.

In addition, according to the embodiments described above, the wide band gap semiconductor device includes a dummy trench 220 formed to reach a position deeper than that of the charge extraction region 32E from the upper surface of the charge extraction region 32E. Then, the emitter electrode 80E is also formed in the dummy trench 220. In addition, the Schottky electrode 71E is formed in the dummy trench 220. In addition, the Schottky electrode 71E is formed in contact with the side surface of the charge extraction region 32. According to this configuration, the Schottky electrode 71E is formed horizontally with respect to the thickness direction of the IGBT 201. Therefore, the size of the dummy trench 220 can be changed appropriately. In addition, the planar size of the charge extraction region 32E can be reduced. Therefore, the pitch per unit cell (cell pitch) can be reduced. As a result, unit cells can be integrated with respect to a limited device area, and low on-resistance can be achieved in the ON state.

In addition, according to the embodiments described above, the wide band gap semiconductor is a silicon carbide semiconductor. According to this configuration, it is possible to achieve a high breakdown voltage, high frequency, and high output semiconductor device.

In addition, according to the embodiments described above, the power conversion apparatus includes a conversion circuit 1201, a drive circuit 1202, and a control circuit 1203. The conversion circuit 1201 includes a wide band gap semiconductor device. In addition, the conversion circuit 1201 converts and outputs power to be input. The drive circuit 1202 outputs a drive signal for driving the wide band gap semiconductor device to the wide band gap semiconductor device. The control circuit 1203 outputs a control signal for controlling the drive circuit 1202 to the drive circuit 1202.

According to this configuration, since the Schottky connection conducts at a voltage lower than that of the PN connection at the interface between the base region and the emitter region, a voltage not less than the built-in voltage is not applied to the PN junction. As a result, the latch-up tolerance increases, and the reliability of the power conversion apparatus improves. In addition, since the structure having the Schottky connection is formed in the same cell as the base region, the elements can be integrated. Therefore, the resistance per unit area can be reduced.

Modifications of Embodiments Described Above

In the embodiments described above, quality of material, material, dimensions, shape, relative arrangement relationship, or condition of implementation of each component may be described, but these are one example in all aspects, and the present invention is assumed not to be limited to those described in the specification of the present application.

Therefore, innumerable modifications not exemplified and their equivalents are assumed within the scope of the techniques disclosed in the specification of the present application. For example, a case of deforming, adding, or omitting at least one component, and furthermore, a case of extracting at least one component in at least one embodiment to combine the extracted component with a component in another embodiment are assumed to be included.

In addition, it is assumed that as long as no contradiction arises, the components described as being provided with "one" component in the embodiments described above may be provided with "one or more" components.

Furthermore, each component in the embodiments described above is a conceptual unit, and the scope of the technology disclosed in the specification of the present application is assumed to include a case where one component includes a plurality of structures, a case where one component corresponds to part of a structure, and furthermore, a case where a plurality of components are included in one structure.

In addition, each component in the embodiments described above is assumed to include structures having other structures or shapes as long as the same function is exhibited.

In addition, the description in the specification of the present application is referred to for all purposes regarding the present techniques, and none are assumed to be conventional techniques.

In addition, in the embodiments described above, when a material name or the like is described without particularly designated, as long as no contradiction occurs, the material is assumed to include a material that contains other additives, such as an alloy.

EXPLANATION OF REFERENCE SIGNS

10: collector region
20: drift region
21, 21A, 21B, 21C, 21F: charge storage region
22: separation region
30, 30A, 30B, 30C, 30D: base region
31, 31A, 31B, 31C, 31D: well contact region
32, 32A, 32B, 32C, 32D, 32E, 32G, 32H, 32I, 32J: charge extraction region
40, 40A, 40B, 40C, 40D: emitter region
50, 50D: gate insulating film
55, 55D: interlayer insulating film
60, 60D: gate electrode
70: ohmic electrode
71, 71D, 71E, 71H, 71J: Schottky electrode
80, 80D, 80E, 80H, 80J: emitter electrode
81: collector electrode
100, 100A, 100B, 100C, 200, 201, 202, 300, 400, 500, 600: IGBT
210: trench
220: dummy trench
1100: power supply
1200: power conversion apparatus
1201: conversion circuit
1202: drive circuit
1203: control circuit
1300: load

The invention claimed is:

1. A wide band gap semiconductor device comprising:
   a drift region made of a first conductivity type wide band gap semiconductor;
   a collector region made of a second conductivity type wide band gap semiconductor, the collector region formed on a lower surface of the drift region;
   a charge storage region made of a first conductivity type wide band gap semiconductor, the charge storage region formed on an upper surface of the drift region and having an impurity concentration higher than that of the drift region;
   a base region of a second conductivity type, the base region partially formed in a surface layer of the charge storage region;
   a charge extraction region of a second conductivity type, the charge extraction region formed to be separated from the base region in a surface layer of the charge storage region and having an impurity concentration higher than that of the base region;
   an emitter region of a first conductivity type, the emitter region partially formed in a surface layer of the base region and having an impurity concentration higher than that of the charge storage region;
   a Schottky electrode formed in contact with the charge extraction region and Schottky-connected to the charge extraction region;
   a gate insulating film formed in contact with the base region at a position sandwiched between the charge storage region and the emitter region;
   a gate electrode formed in contact with the gate insulating film;
   an emitter electrode formed to cover the Schottky electrode and the emitter region; and
   a collector electrode formed on a lower surface of the collector region.

2. The wide band gap semiconductor device according to claim 1, wherein a built-in voltage of a Schottky barrier diode formed between the Schottky electrode and the charge extraction region is lower than a built-in voltage of a diode formed between the base region and the emitter region.

3. The wide band gap semiconductor device according to claim 1,
   further comprising a separation region of a first conductivity type, the separation region formed in contact with a lower surface of part of the charge extraction region, and
   wherein an impurity concentration of the separation region is equal to an impurity concentration of the drift region.

4. The wide band gap semiconductor device according to claim 1,
   wherein in a plan view, a plurality of the base regions are arranged in a surface layer of the charge storage region,
   wherein the plurality of base regions are two-dimensionally arranged in a first direction and a second direction orthogonal to the first direction in a plan view,
   wherein a region, extending in the first direction, in which the base region is not arranged is assumed as a first region, and a region, extending in the second direction, in which the base region is not arranged is assumed as a second region, and
   wherein the charge extraction region is formed in the first region and the second region in a plan view.

5. The wide band gap semiconductor device according to claim 4,
   wherein in a plan view, the charge extraction region is formed in part of the first region in a width direction and in part of the second region in a width direction.

6. The wide band gap semiconductor device according to claim 4,
   further comprising a well contact region of a second conductivity type, the well contact region formed to reach the base region from an upper surface of the emitter region, and
   wherein an area of the charge extraction region in a plan view is 0.05 times or more and 0.5 times or less a sum of an area of the base region, an area of the emitter region, and an area of the well contact region in a plan view.

7. The wide band gap semiconductor device according to claim 4,
   wherein a region in which a first region in which the base region is not arranged, the first region extending in the first direction intersects a second region in which the base region is not arranged, the second region extending in the second direction is assumed to be an intersection region, and
   wherein the charge extraction region is formed in the first region and the second region except the intersection region in a plan view.

8. The wide band gap semiconductor device according to claim 7,
   wherein in a plan view, the charge extraction region is formed in part of the first region and in part of the second region except the intersection region.

9. The wide band gap semiconductor device according to claim 1,
   wherein in a plan view, a plurality of the base regions are arranged in a surface layer of the charge storage region,
   wherein the plurality of base regions are two-dimensionally arranged in a first direction and a second direction orthogonal to the first direction in a plan view, and
   wherein the charge extraction region is formed to be replaced by some of the plurality of base regions to be arranged.

10. The wide band gap semiconductor device according to claim 1,
    further comprising a trench formed to reach a position deeper than that of the base region from an upper surface of the emitter region,
    wherein the gate insulating film is formed to cover a side surface of the base region sandwiched between the charge storage region and the emitter region in the trench, and
    wherein the gate electrode is formed to be surrounded by the gate insulating film in the trench.

11. The wide band gap semiconductor device according to claim 1,
    further comprising a dummy trench formed to reach a position deeper than the charge extraction region from an upper surface of the charge extraction region,
    wherein the emitter electrode is also formed in the dummy trench, and
    wherein the Schottky electrode is formed in the dummy trench, and is formed in contact with a side surface of the charge extraction region.

12. The wide band gap semiconductor device according to claim 1,
    wherein the wide band gap semiconductor is a silicon carbide semiconductor.

13. A power conversion apparatus comprising:
a conversion circuit including a wide band gap semiconductor device according to claim 1, the conversion circuit configured to convert and output power to be input;
a drive circuit configured to output a drive signal for driving the wide band gap semiconductor device to the wide band gap semiconductor device; and
a control circuit configured to output a control signal for controlling the drive circuit to the drive circuit.

* * * * *